United States Patent [19]

Hasegawa et al.

[11] Patent Number: 5,579,006

[45] Date of Patent: Nov. 26, 1996

[54] A/D CONVERTER

[75] Inventors: Hiroshi Hasegawa; Michio Yotsuyanagi, both of Tokyo, Japan

[73] Assignee: NEC Corporation, Tokyo, Japan

[21] Appl. No.: 358,320

[22] Filed: Dec. 19, 1994

[30] Foreign Application Priority Data

Dec. 28, 1993 [JP] Japan .................................. 5-334128
Sep. 7, 1994 [JP] Japan .................................. 6-213777
Sep. 7, 1994 [JP] Japan .................................. 6-213778

[51] Int. Cl.$^6$ ........................................ H03M 1/44
[52] U.S. Cl. ................................ 341/162; 341/135
[58] Field of Search ................................ 341/135, 156, 341/161, 162

[56] References Cited

U.S. PATENT DOCUMENTS 4,229,729  10/1980  Devendorf et al. .................... 341/156
4,306,224  12/1981  Geller et al. ............................ 341/162

OTHER PUBLICATIONS

Krenik et al; "Current–Mode Flash A/D Conversion Based on Current–Splitting Techniques"; 1992 IEEE International Symposium on Circuits and System, vol. 2, pp. 585–588.

Primary Examiner—Marc S. Hoff
Attorney, Agent, or Firm—Whitham, Curtis, Whitham and McGinn

[57] ABSTRACT

An analog input signal current is split into a tree form. Hierarchical subtraction process for subtracting a comparison reference current is performed in each current path in the tree structure. At the final stage of the tree structure, the current is compared with a reference current to obtain a digital signal on the basis of results of comparison.

20 Claims, 18 Drawing Sheets

A/D CONVERTER

BACKGROUND OF THE INVENTION

1. Field of the Invention

The present invention relates to an analog to-digital (A/D) converter. More specifically, the invention relates to a current mode A/D converter.

2. Description of the Related Art

In recent years, A/D converters which consume less power are desirable especially for low power digital circuits that accommodate analog and digital signals. A current mode A/D converter, which is less sensitive to digital noise, is common in such circuits.

A prior art A/D converter is illustrated in FIG. 18A. An analog input signal current $I_{in}$ and an offset current $I_{off}$ are applied to an input transistor of a current mirror circuit CM. The current mirror circuit CM has a plurality of output transistors which generate a plurality of current outputs. Specifically, in the case of an N-bit A/D converter, $(2^N-1)$ of the input currents $I_{in}$ are generated by the current mirror circuit CM which are respectively compared with $(2^N-1)$ of comparison currents S by current comparators H. The results of these comparison are input to an encoder EN to perform encoding to obtain the desired digital code.

FIG. 18B shows an example of a current-splitting type current mode A/D converter which has been disclosed in 1992 IEEE International Symposium on Circuit and System, Vol. 2, pp 585–588. The shown circuit is also constructed with a current mirror circuit having a plurality of current outputs, in which the analog input signal current $I_{in}$ and offset current $I_{off}$ are split into a corresponding number $(2N-1)$ of comparators H for comparison with comparison currents $I_{ref}$. The results of these comparisons are input to an encoder EN to perform encoding to obtain the desired digital code.

The circuit shown in FIG. 18A, requires a large number $(2^N-1)$ of comparison currents in proportion to the total comparison current which makes the overall current consumption large. In the circuit of FIG. 18B, the current consumption is large since the construction is the same as the prior art structure of FIG. 18A except for splitting of the input current. Furthermore, in the circuit of FIG. 18B as applied to an N-bit A/D converter, the input current becomes as large as 2N * (2N−1)ΔI (wherein ΔI is the current corresponding to 1 LSB). This prevents lowering the power source voltage. Thus, in the prior art, high current consumption prevents lowering the power source current.

Also, in general, lowering the power source voltage causes degradation of precision of the mirror ratio of the current mirror or causes fluctuation of a threshold voltage. None of the prior art provides a solution for this problem.

As forth above, the conventional current mode A/D converters cannot lower current consumption and power source voltage and provide high precision.

SUMMARY OF THE INVENTION

Therefore, it is an object of the present invention to provide an A/D converter which lowers current consumption, power consumption and/or power source voltage, and/or improves precision level.

Another object of the present invention is to provide a current mode A/D converter suitable for an application requiring low current consumption, low power consumption and/or low power source voltage with satisfactorily high level precision.

According to the present invention, an analog to-digital converter comprises:

an input current mirror circuit having a current input terminal to be supplied an analog signal current and a plurality of current output terminals;

a constant current source supplying a constant current to the current input terminal for subtracting the constant current from the analog signal current;

a tree structure taking the input current mirror circuit as a route and taking a plurality of signal paths of the current output terminals of the input current mirror circuit as branches;

each stage of the tree structure a plurality of current mirror circuits, each having an input terminal inputting a current of corresponding one of the plurality of output terminal of the current mirror circuit in the preceding stage and a plurality of current output terminals, and a plurality of constant current sources supplying constant current to a plurality of current output terminals of each current mirror circuit in own stage for subtracting the constant current from the output current of the corresponding current mirror circuit in the preceding stage; and a plurality of current comparator circuits comparing respective of output current value of the current output terminals of respective current mirror circuits in the final stage of the tree structure for generating a digital code with comparator outputs of the plurality of current comparator circuits.

In the preferred construction, the input current mirror circuit includes an input transistor, a plurality of output transistors having control electrodes commonly connected to the control electrode of the input transistor, and switch for turning ON and OFF of common connection between the control electrode of the input transistor and control electrodes of the output transistors;

each of current mirror circuits in each stage of the tree structure includes an input transistor, a plurality of output transistors having control electrodes commonly connected to the control electrode of the input transistor, and switch for turning ON and OFF of common connection between the control electrode of the input transistor and control electrodes of the output transistors; and the analog-to-digital converter includes an ON/OFF control means for ON/OFF controlling the switch of the input current mirror circuit and the switches of the current mirror circuits in respective stages of the tree structure.

The analog-to-digital converter may further comprise:

a sample/hold circuit for sample/holding the input signal level; and a voltage-to-current converter for converting the output of the sample/hold circuit into the analog signal current.

Also, each of the constant current sources comprises an input transistor, a plurality of output transistors having control electrodes commonly connected to the control electrode of the input transistor, and switch for turning ON and OFF of common connection between the control electrode of the input transistor and control electrodes of the output transistors, and a capacitive element provided in parallel to the control electrode of the output transistor;

digital-to-analog converter circuit for converting output data of the memory into an analog current;

switch group consisted of a plurality of switches for turning ON and OFF controlling states of the output terminals of the digital-to-analog converter and input electrode of the input transistor of the each current mirror circuit;

first control means for generating an address signal for selectively turning ON one of the switches of the current mirror circuit;

second control means for generating an address signal for selectively turning ON one of switches the switch group; and address generating means for cyclically generating an address signal for the memory and address signals of the first and second control means in synchronism with each other.

BRIEF DESCRIPTION OF THE DRAWINGS

The present invention will be understood more fully from the detailed description given hereinafter and from the accompanying drawings of the present invention, which, however, should not be taken as limiting the present invention, but are for explanation and understanding only.

In the drawings.

DESCRIPTION OF THE PREFERRED EMBODIMENTS

The present invention will be discussed hereinafter in terms of preferred embodiments with reference to the accompanying drawings, particularly to FIGS. 1 to 17. In the following description, numerous specific details are set forth in order to provide a thorough understanding of the present invention. It will be obvious, however, to those skilled in the art that the present invention may be practiced without these specific details. In other instances, well-known structures are not shown in detail in order not to obscure the present invention.

In the present invention, an analog input signal current is split into respective branches by means of multi-stage current mirror circuits forming a hierarchical tree structure. A current for comparison reference is subtracted from the split current of respective branches. By comparing current at the final stage of structure in current comparators, a digital code is obtained.

A circuit mirror circuit in the tree structure which forms one unit splits one input current into a plurality of output currents. The structure, is referred to as hierarchical tree structure. The tree structure with the current mirror circuits is further connected to each of the outputs of the current mirror circuit, and repeats such connections.

Figure 1:
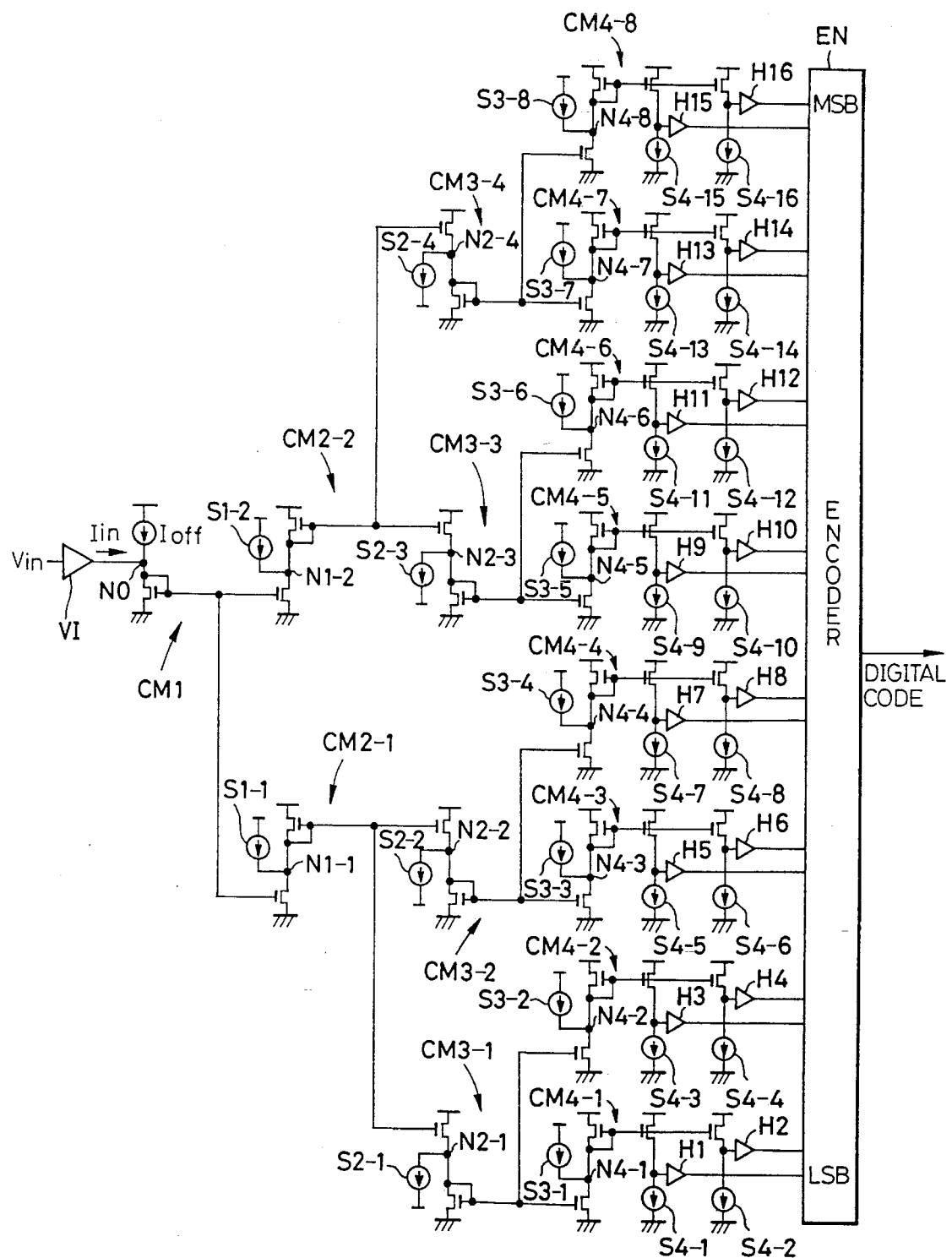
FIG. 1 is a circuit diagram of one embodiment of an A/D converter according to the present invention.

In the following disclosure, the tree structure will be referred to as an n-bit m stage structure. Namely, in case of the n-bit m stage structure, the number of outputs of the first current mirror circuit is $2^n$. By repeating connection of the current mirror circuits for m stages, the hierarchial structure as shown in FIG. 1 is established. When no redundancy is provided for the n-bit m stage construction, the A/D converter becomes an n x m-bit A/D converter. For instance, when n=1 and m=4, the A/D converter becomes a 4-bit A/D converter with a binary tree construction.

FIG. 1 shows an embodiment of the 4-bit A/D converter of four stage construction. In this case, the analog input signal current is split gradually from the input end of the first or leading current mirror circuit to the final current mirror circuits. The input signal is split in half at respective current mirror circuits in respective stages. In the following disclosure, respective stages in the A/D converter will be referred to as first, second, ... nth stages in order from the stage near the input end. For instance, the first stage includes a current mirror circuit CM1 and constant current sources S1-1 to S1-2 for generating a reference current, the second stage includes current mirror circuits CM2-1 and CM2-2 and constant current sources S2-1 to S2-4. Also, the constant current source S1-1 to S3-8 for generating comparison currents to be subtracted in respective subtracting nodes N1-1 to N4-8 at the intermediate portion of the transfer path, perform substantially equivalent function as the comparison current generated by the constant current sources S4-1 to S4-16 in the final stage including comparators H1 to H16. Hereinafter, these comparison currents generated by the constant current sources S1-1 to S3-8 and S4-1 to S4-16 will be referred to as the subtracting comparison current. At this time, the comparator compares a result of subtraction of the comparison current from the output current of the mirror current circuit and the current 0 level.

FIG. 1 shows a voltage-to-current (V/I) converter VI for converting a voltage signal into a current when the input signal is a voltage signal. Respective outputs of the comparators H1 to H16 are input to an encoder EN to be encoded and output as a desired digital code.

Figure 2:
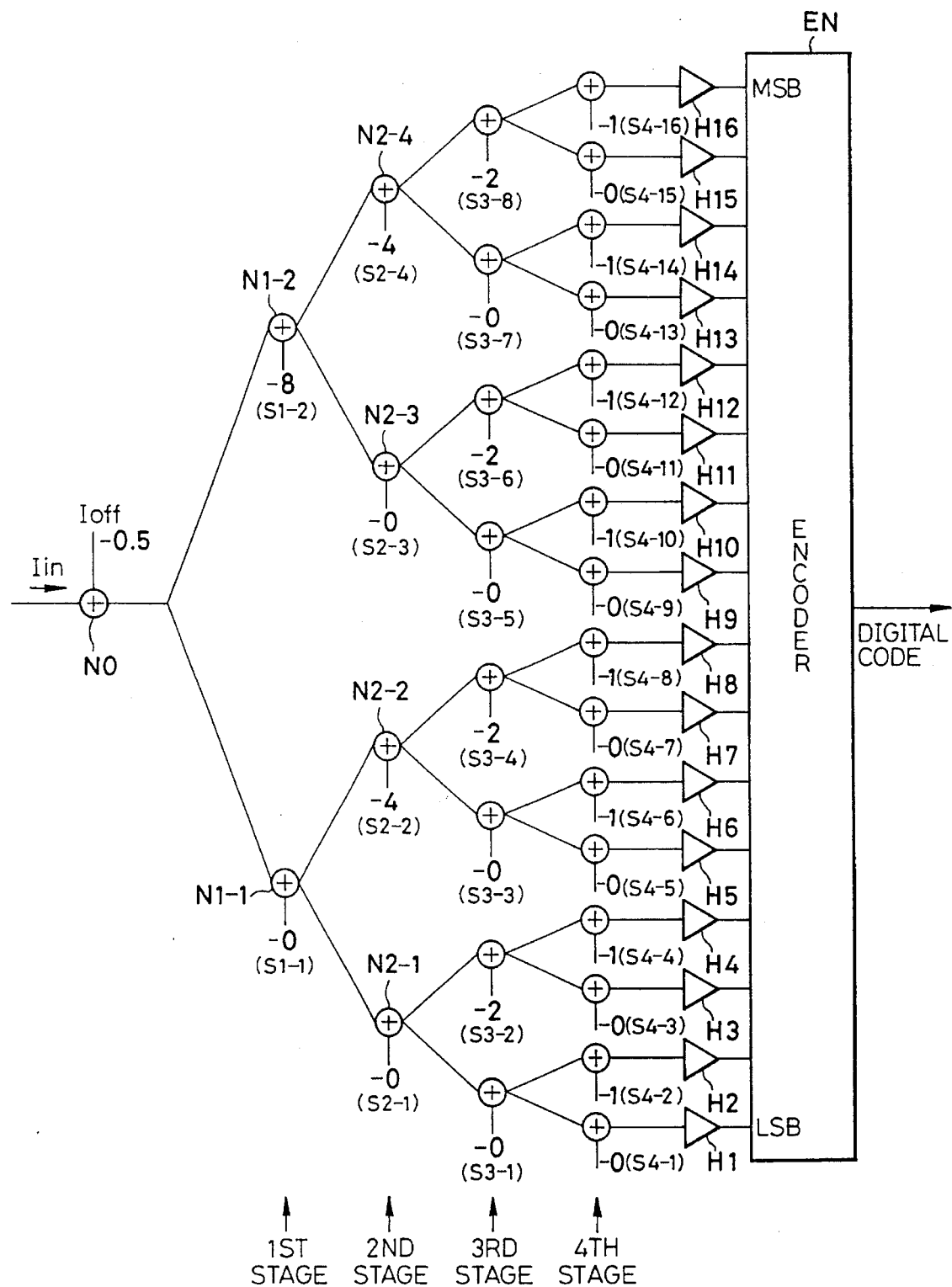
FIG. 2 is an equivalent diagram of the circuit of FIG. 1.

FIG. 2 shows an equivalent diagram of the 4-bit A/D converter of one bit of the four stage construction of FIG. 1.

Hereinafter, a principle of conversion will be discussed for the 4-bit A/D converter with reference to FIG. 2. Here, it is assumed that a full scale current is "16" and a current corresponding to 1 LSB is "1". Also, it is assumed that the current ratio in all of the current mirror circuit is 1:1. In FIG. 2, a node at the nth stage and the mth order from the bottom is designated as (n,m). The number of comparators to be used is 16 including that for detecting overflow. The comparators are identified as H1, H2, ... H16 in the order from the lowermost one. Each comparator is designed to output "L" level when the input is a negative value and "H" level when the input is a positive value to establish a thermometer code with overall outputs. For simplification, an offset current of the input current per se, is assumed to be zero (0). The subtracting comparison current in the nth stage is two kinds, i.e. $-0$ and $-16/2^n$ as shown in FIG. 2. In order to obtain normal conversion characteristics, an offset of $-0.5$ is added as an offset current $I_{off}$ for the input current $I_{in}$ before inputting to the first stage. However, it is possible to add an offset for the subtracting comparison current in another stage.

In the example, it is assumed that the input current is "6". Since an initial subtracting comparison current in the tree having a route of (1,2) is "$-8$", after subtraction at (1,2), all current becomes negative so that the outputs of the comparators H9 to H16 all become "L". Similarly, the current having the route at (3,4) is already negative (i.e. 6–0.5–4–2=–0.5), the outputs of the comparators H7 and H8 also become "L". On the other hand, in case of the comparator H6, the output is positive (i.e., 6–0.5–4–0–1=+0.5) and thus is "H". Similarly, the outputs of the comparators H5 to H1 become "H".

From the foregoing, the reference code of "(MSB side) LLLLLLLLLLHHHHHH (LSB side)" can be obtained. From the foregoing example, the number of paths from input to the terminating end of the tree becomes $2^4$. Since the kinds of the subtracting comparison current (overall total) in each other is $2^4$, any of the input current can be converted into the reference code in the similar manner to the foregoing.

Figure 3:
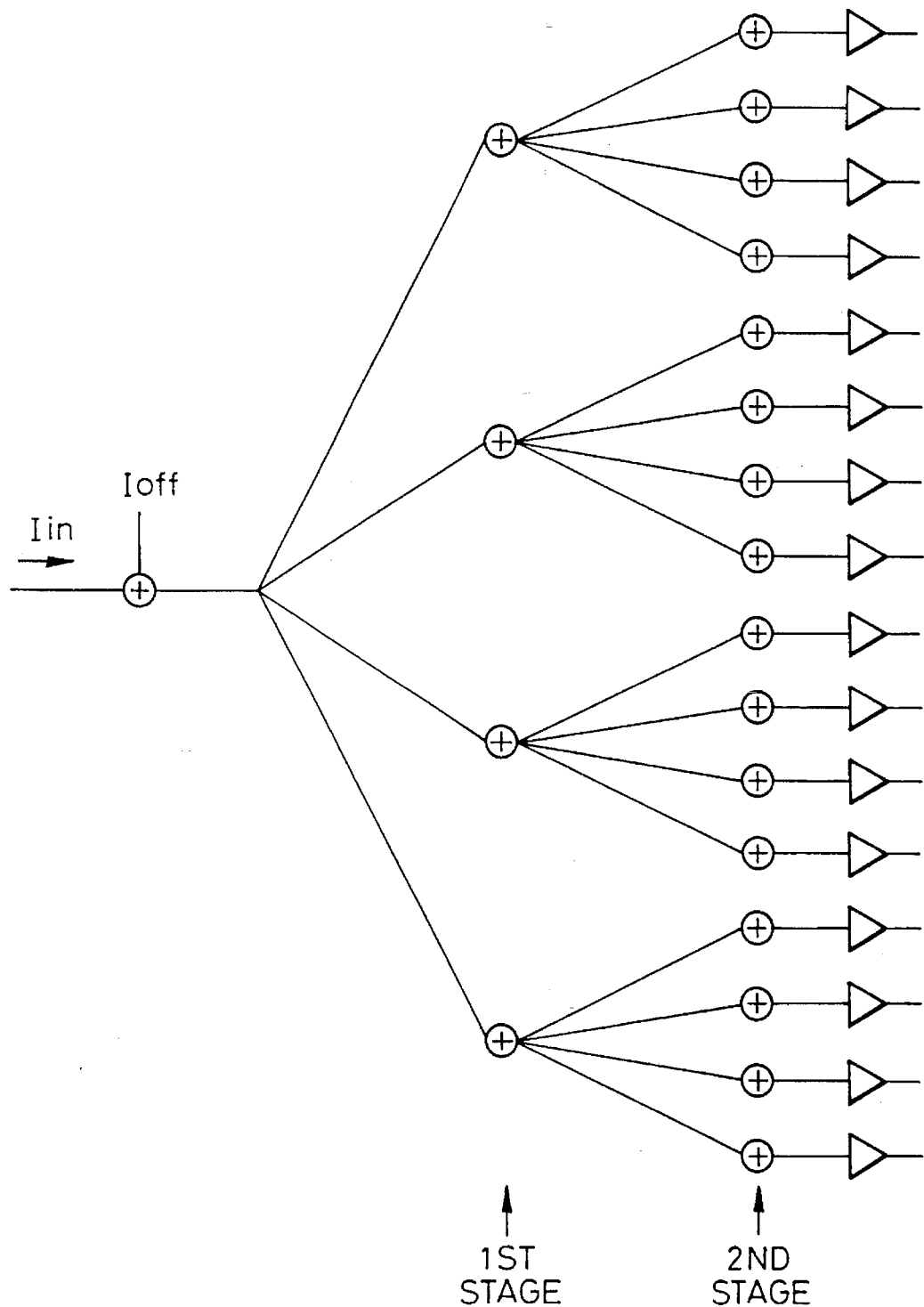
FIG. 3 is an equivalent diagram of another embodiment of the A/D converter according to the present invention.
Figure 4:
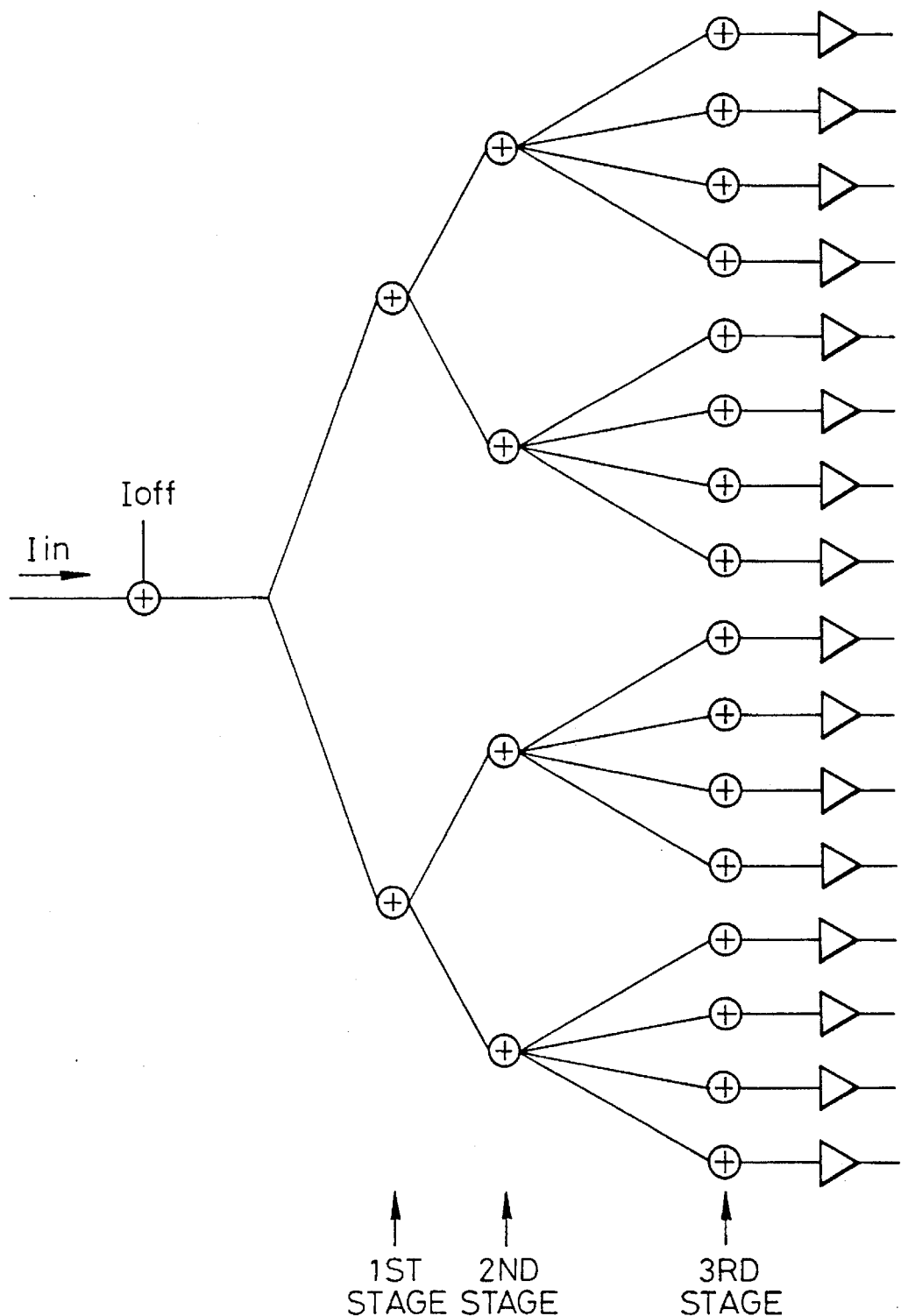
FIG. 4 is an equivalent diagram of a further embodiment of the A/D converter according to the present invention.

Even for the same 4-bit A/D converters, various bits and stage constructions can be achieved. FIGS. 3 and 4 show hypothetical examples of the variation of the bit and stage construction of the 4-bit A/D converter. FIG. 3 shows a 2-bit 2-stage construction, and FIG. 4 shows construction of a combination of a 1-bit 2-stage and a 2-bit 1-stage structures. Thus, there is a wide variety of options when adapting the circuit characteristics.

The superiority of the A/D converter of the present invention and its low power and current consumption are discussed below.

Figure 5:
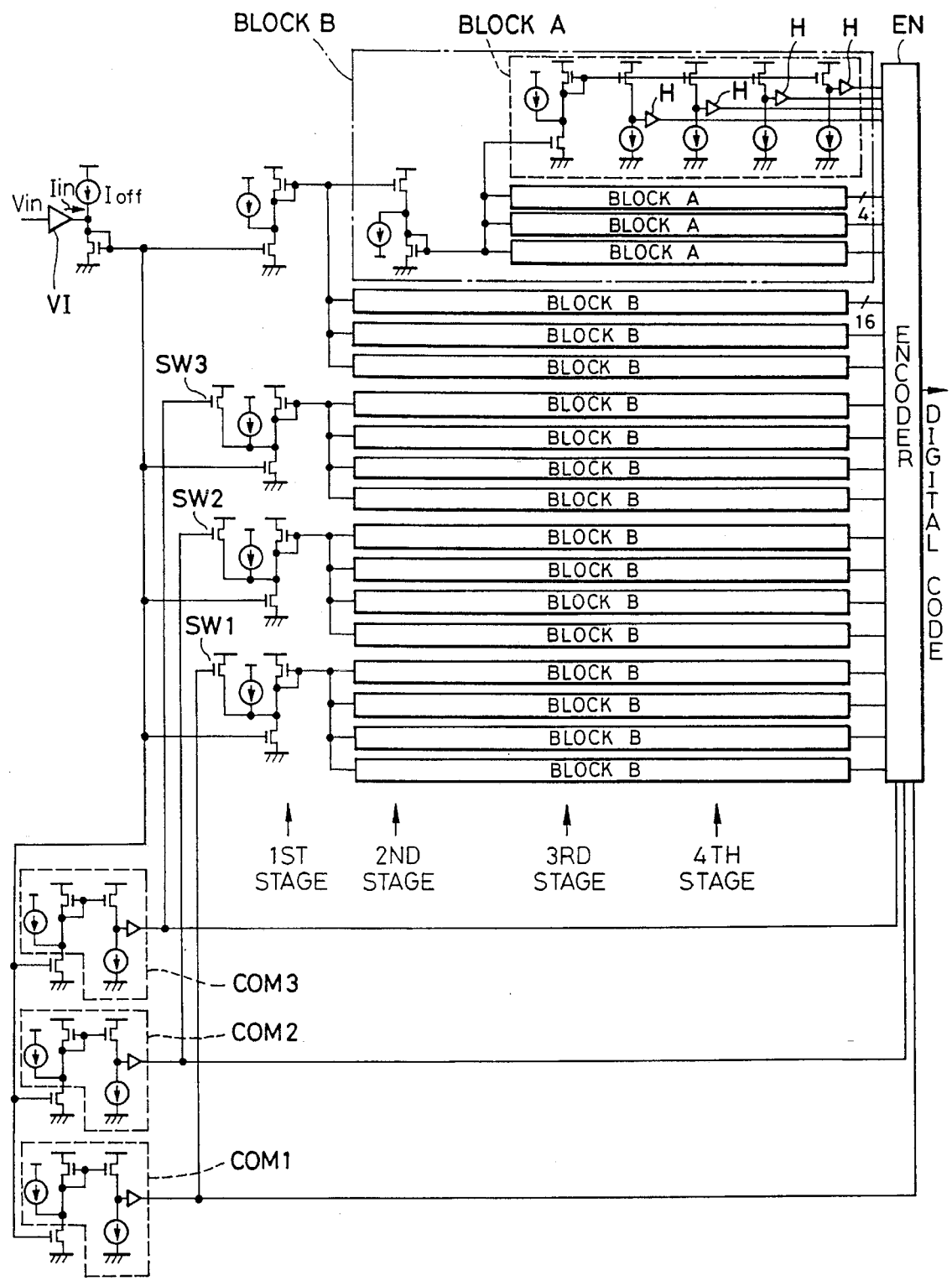
FIG. 5 is a circuit diagram of a still further embodiment of the A/D converter according to the present invention.
Figure 6:
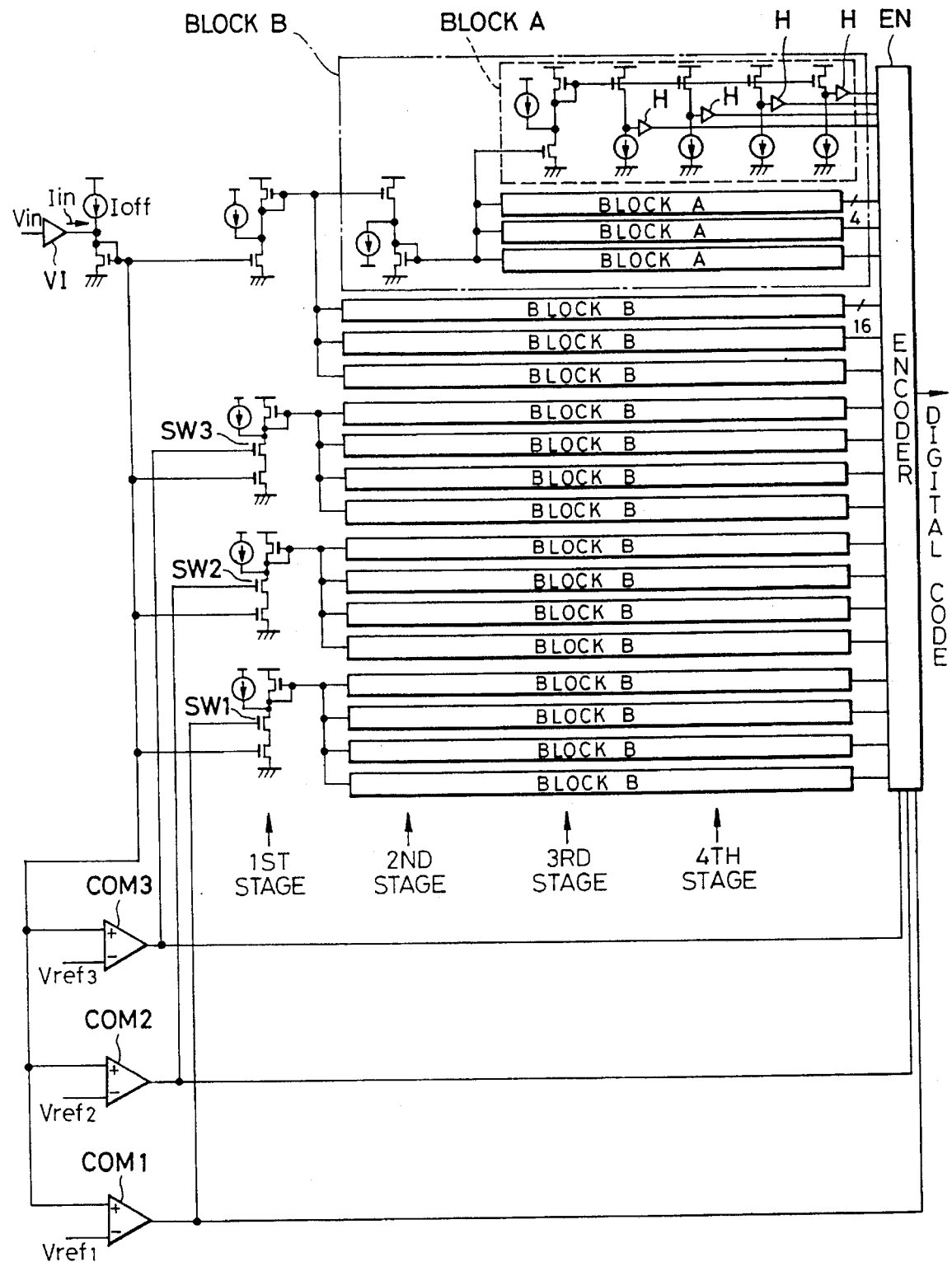
FIG. 6 is a circuit diagram of a yet further embodiment of the A/D converter according to the present invention.

An embodiment of the present invention is an 8-bit A/D converter having a 2-bit four-stage construction, shown in FIGS. 5 and 6. In FIGS. 5 and 6, the second and subsequent stages in the tree construction are shown as blocks A and B. In FIGS. 5 and 6, pre-comparators COM1 to COM3 are provided as additional circuits (current reduction circuit) which will be discussed later for reducing current consumption.

Hereinafter, the consumed current of the A/D converter of FIG. 5 is compared with that of the prior art A/D converter in FIGS. 18A and 18B. Here, the A/D converter is assumed to be an 8-bit A/D converter and the current corresponding to 1 LSB is $\Delta I$ and the full scale FS input current is assumed to be 256$\Delta I$. It should be noted that current consumption for auxiliary current, for generating the offset current to be added to the input current, a bias current and the subtracting comparison current is disregarded. Also, consumed current by the comparator, encoder and so forth are disregarded.

For example, in the prior art structure of FIG. 18A, the consumed current can be derived as follows. When an amplitude of the input signal current is $n\Delta I$ (wherein integer of 0 to 255), the consumed current IT is calculated by:

$$IT = \sum_{j=0}^{n} \Delta I * j + (255 - n)n\Delta I \quad (1)$$

Figure 18A:
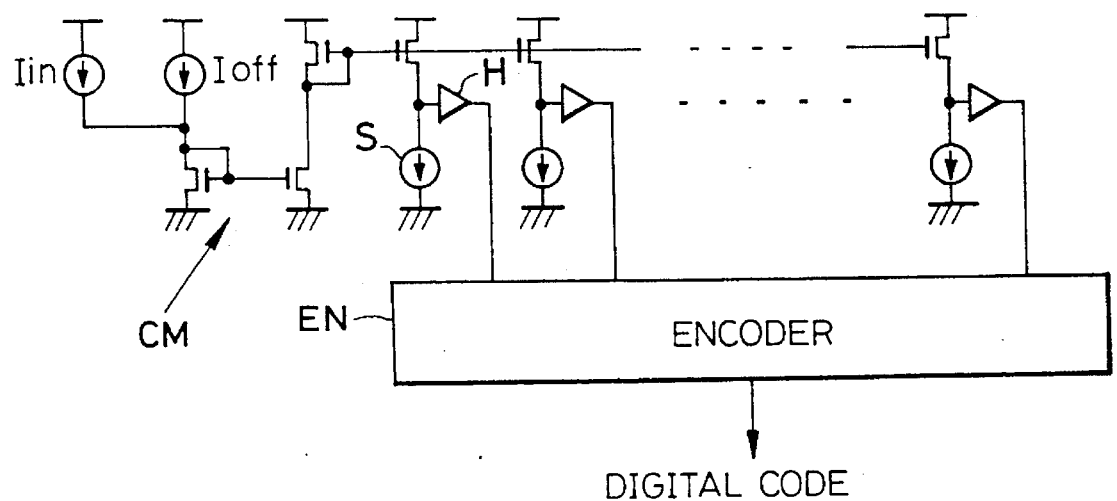
FIGS. 18A and 18B are illustration of the conventional current mode A/D converter.
Figure 18B:
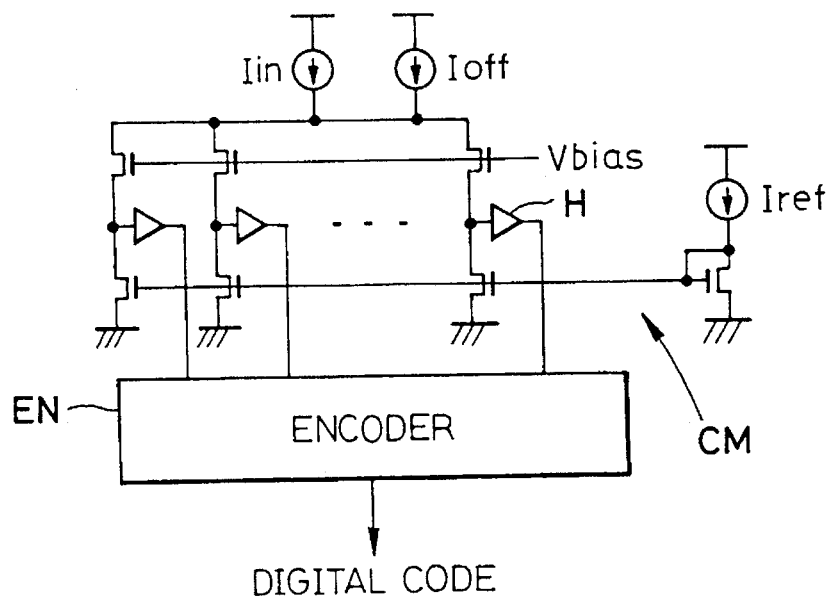

Similarly, of the second prior art structure of FIG. 18B, the consumed current IT is calculated by:

$$IT = \sum_{j=0}^{n} \Delta I * j + (255 - n)n\Delta I \quad (2)$$

On the other hand, the number of kinds of comparison current of the A/D converters of FIGS. 18A and 18B is 255 n$\Delta I$ (n=1 to 255) and number is 255.

The consumed current of the A/D converter of FIG. 5 in the present invention is as follows. Here, the magnification (mirror ratio) of the current mirror circuit in the signal path is 1:1. The subtracting comparison currents at the nth stages (n=1 to 4) are respectively 0, $FS/4^n$, $FS * 2/4^n$ and $FS * 3/4^n$. Accordingly, the number of kinds of the subtracting comparison currents of the A/D converter according to the present invention is 16 and the total number of subtracting comparison currents becomes 340.

The consumed current at respective nodal points in the tree structure is determined by the subtracting comparison current IM at the relevant nodal point N and the current IA(N–1) of the immediately preceding nodal point (closer to the root) to the relevant nodal point. Assuming that the subtracting comparison current is generated by the current mirror circuit, in view of the structure of the current mirror circuit on the nodal point, the consumed current IS at the nodal point can be expressed by:

When $IA(N-1) \geq IM$, $IS$ = $IA(N-1):IA(N)$ (3)
= $IA(N-1) - IM$

When $IA(N-1) < IM$, $IS = IA(N-1):IA(N) = 0$ (4)

wherein IA(N) is the current at the relevant nodal point.

Accordingly, by utilizing the foregoing expressions (3) and (4), the overall consumed current IT can be calculated.

Next, consideration is given for when pre-comparators COM1 to COM3 are added to the current reduction circuit. This performs a comparison of the signal current with a certain level of comparison current by the pre-comparators COM1 to COM3 near the root to shut off the signal current of unnecessary trees for conversion on the basis of the results of the comparisons. For this purpose, switches SW1 to SW3 are provided for the current mirror circuit. By these switches SW1 to SW3, the signal current of the tree structure is shut down.

FIG. 5 shows when a current comparator is employed as the pre-comparators COM1 to COM3. Also, since the voltage at respective nodal points in the tree structure is varied depending upon the amplitude of the signal current, a voltage comparator comparing a nodal point voltage with a comparison voltage at a given voltage level can be employed as the pre-comparator. FIG. 6 shows the case where the voltage comparator is employed as the precomparator COM1 to COM3.

In FIGS. 5 to 6, three of four nodal points are shut down (1,1) to (1,3) reducing subtracting comparison current.

In FIG. 5, the signal current is shut down by connecting a transistor in parallel to the subtracting comparison current at the nodal point and by turning ON the transistor when the current level of the signal current becomes equal to or greater than a given level to make the subtracting comparison current equivalently greater. At this time, a condition the same as the expression (4) is established so that the signal current flowing to the relevant nodal point becomes "0" which makes the tree current consumption, including the relevant nodal point, substantially "0". At this time, in some encoder EN, it is possible that the output of the comparator H at the end of the tree becomes undetermined. Therefore, the output of the terminal end comparator is changed to "H" by the output of the pre-comparator to prevent malfunction.

In FIG. 6, shutting down of the signal current is performed by simply shutting off the signal path in the current mirror circuit by switches SW1 to SW3. However, it is not suitable to provide the switch within the signal path for this may cause a voltage drop and degradation of precision or lower speed.

Here, depending upon the input current Iin, when Iin>192ΔI, shutting down is performed for nodal points in the first stage at third and lower positions;

when Iin>128ΔI, shutting down is performed for nodal points in the first stage at second and lower positions; and when Iin>64ΔI, shutting down is performed for nodal points in the first stage at the lowest position.

Figure 7:
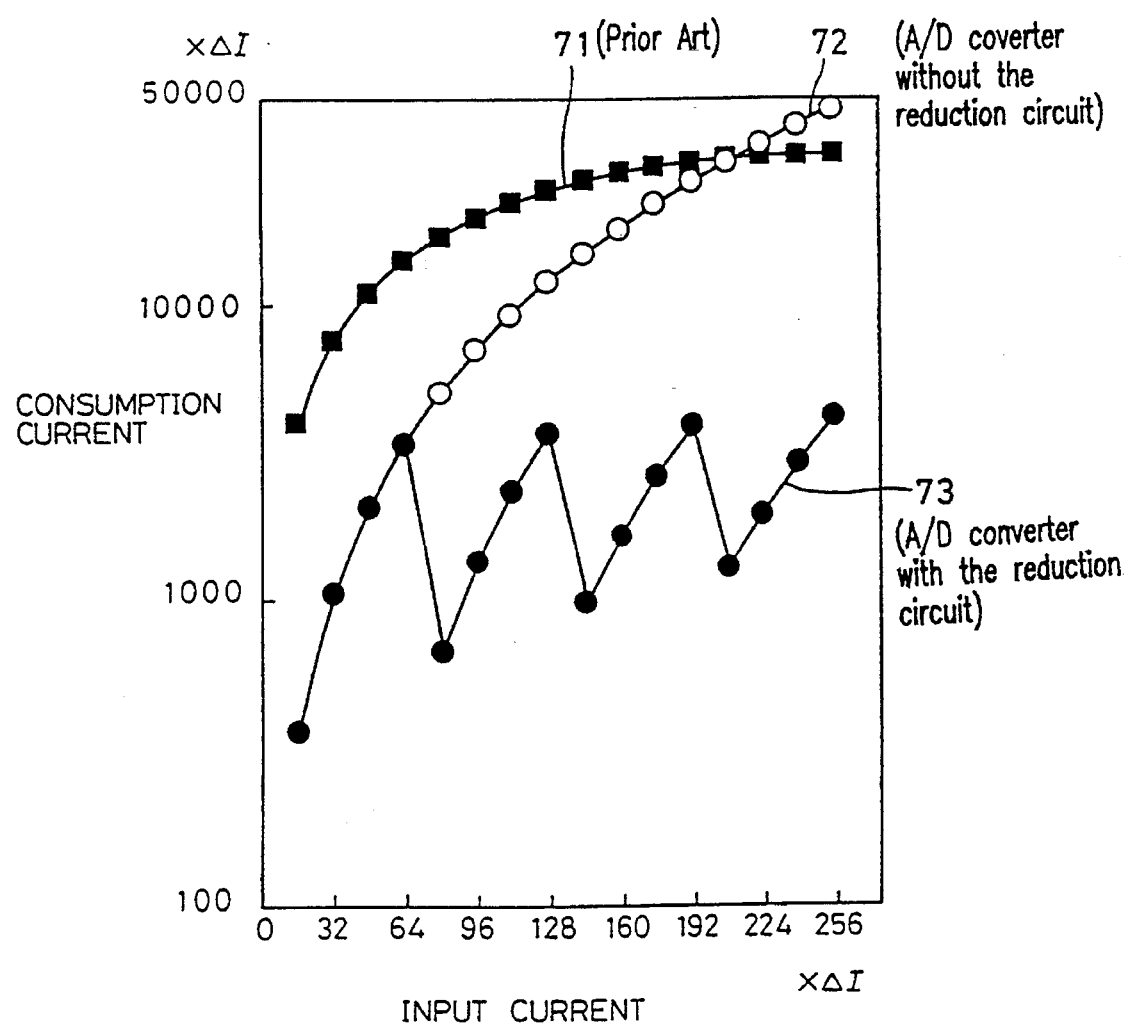
FIG. 7 is an illustration showing a current consumption characteristics of the present invention and the prior art.

Under the guidelines set forth above, the results of calculations of the consumed current in the prior art structures in FIGS. 18A and 18B, the present invention without the current reduction circuit and the present invention with the current reduction circuit are shown by curves 71, 72 and 73 in FIG. 7, respectively.

From FIG. 7, in the present invention without the current reduction circuit, the consumed current becomes larger than that of the prior art structures at a large input current, since substantially all the current may flow through the nodal point having small subtracting comparison current if the input current is large and a large number of such nodal points are present in the tree structure. However, when the input current is small, the present invention without the current reduction circuit has smaller consumed current than that of the prior art structure.

In the present invention with the current reduction circuit, the consumed current is significantly reduced in comparison with the prior art in overall input current range. Here, while the consumed current of the additional circuit, such as the pre-comparators and the consumed current at the nodal points shutting off the current, such consumed current should be several hundreds of ΔI to thousands of ΔI and can be ignored in comparison with the prior art.

From the results set forth above, by employing the A/D converter of the present invention, the current reduction circuit can be easily connected to significantly reduce the consumed current when compared to the consumed power in comparison with the prior art.

Next, the superiority of the A/D converter according to the present invention in view of the lowering of power consumption, lowering of power source voltage and enhancing precision is discussed.

At first, correction of the subtracting comparison current will be discussed. In general, lowering the power source voltage causes degradation of transistor circuit characteristics and increases fluctuation of elements. Also, in general, when high precision is required for large bit numbers required for the A/D converter, correction becomes necessary. Accordingly, for achieving lowering of the power source voltage and enhancement of precision, it becomes necessary to correct the comparison voltage or comparison current. For instance, it may be necessary to trim a resistance value of a resistor ladder in the voltage mode A/D converter to correct the comparison voltage. In the current mode A/D converter, the comparison current (i.e. the current source current) has to be corrected, which corresponds to correction of the subtracting comparison current source.

In the correction of current source, namely when the current source is variable, it is possible that the output through the output terminal should be supplied via the current mirror circuit rather than directly to the terminal (node) to be corrected. Typically, the variable current source has a greater circuit scale than a fixed current source and has greater parasitic capacitance at the output terminal per se. Therefore, direct supply of the output to the node may increase the load of the signal path.

Namely, when a large parasitic capacitance is present at the output terminal per se of the variable current source or when the wiring resistance or wiring capacity for the terminal needed to be corrected is large due to large circuit area of the variable current source, the output through the output terminal should be supplied via the current mirror circuit rather than directly to the terminal (node) to be corrected. Also, when a substantial voltage drop is caused in the variable current source per se, connection to the terminal to be corrected cannot be established for lowering the power source voltage. Accordingly, in order to use the variable current source but not to lower the power source voltage and not to increase the load on the signal path, it is beneficial to feed the current through the current mirror circuit. However, when the current is supplied through the current mirror circuit, consumption of the current is increased and signal current flowing through the power source per se and current flowing through the output terminal are consumed.

When correction of the variable current source is performed through the current mirror circuit in the conventional 8-bit A/D converter of FIGS. 18A and 18B, increased amount ΔIT becomes a total sum of the comparison current when the mirror ratio is 1.

$$IT = \sum_{j=0}^{255} \Delta I * j = 32000 \Delta I \tag{5}$$

Accordingly, the overall maximum consumed current doubles.

On the other hand, in case of the A/D converter according to the present invention, the increased amount of the consumed current becomes a total sum of the subtracting comparison current IM.

$$\Delta IT = \Sigma IM = 1600 \Delta I \tag{6}$$

Therefore, the overall maximum consumed current increases only about 25%, since smaller comparison currents are used in the A/D converter according to the present invention to make the total comparison currents smaller. Namely, the A/D converter according to the present invention features a smaller overall subtracting comparison current (total sum thereof) per se in comparison with the prior art. Even when the correction current source is employed, the increasing amount of the consumed current is small.

Accordingly, by employing the A/D converter, in addition to preventing minimizing increased consumed current, the correction circuit achieves a lower power source voltage and higher precision.

Figure 8A:
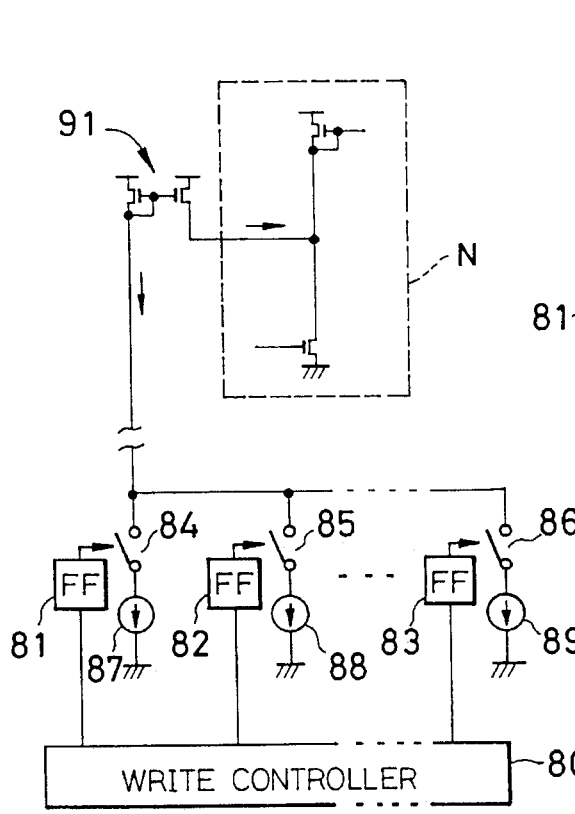
FIG. 8A is an illustration showing a current correction circuit for performing correction for a constant current source for comparison reference in the circuit of FIG. 1.
Figure 8B:
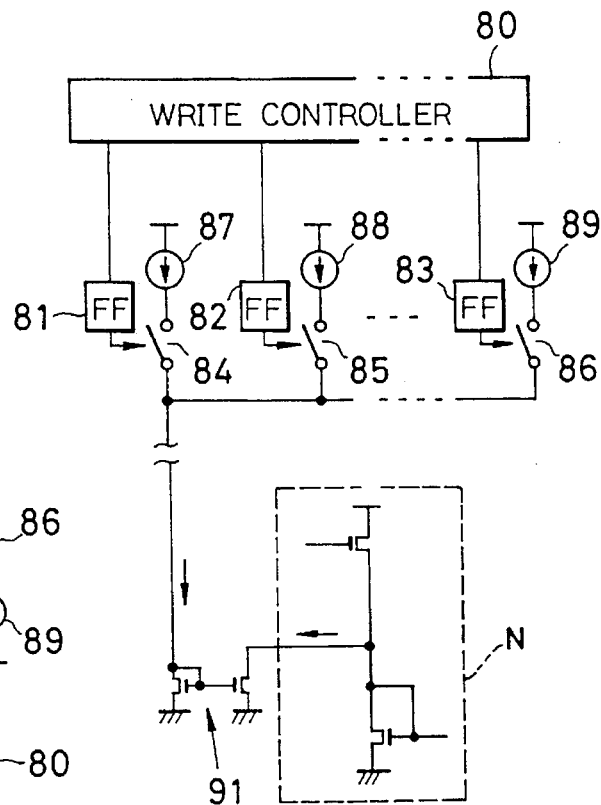
FIG. 8B is an illustration showing another embodiment of the current correction circuit.
Figure 8C:
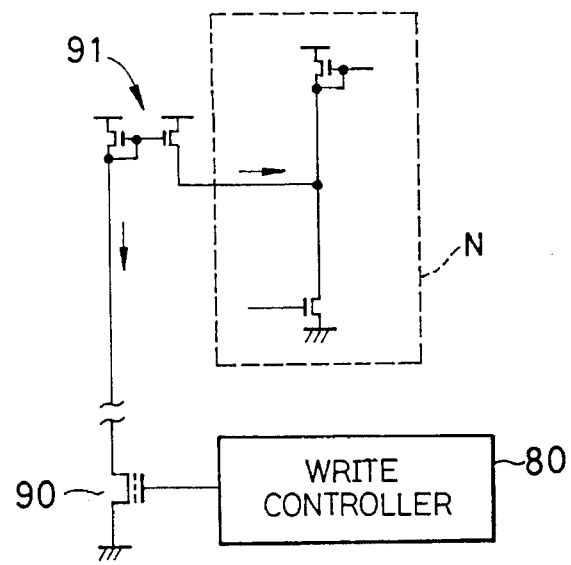
FIG. 8C is an illustration showing a further embodiment of the current correction circuit.

An embodiment of the correction current source is shown in FIGS. 8A to 8C. The embodiment of the correction current source shown in FIGS. 8A and 8B is a digital-type, in which the current source is adjusted by turning ON and OFF switches 84 to 86 with digital signals stored in memories comprising flip-flops 81 to 83. The output current of this circuit is supplied to the subtracting nodal point N via the current mirror circuit as the subtracting comparison current. As a result, a transistor size of the current mirror circuit 91 can be made smaller. Also, the voltage drop of the switches 84 to 86 can be separated from the signal path. Furthermore, by locating the current mirror circuit near the current subtracting nodal point N, the influence of wiring capacitance and wiring resistance on the signal current can be reduced or be made advantageous for speed and layout.

A writing control circuit 80 is adapted to control writing of data to the memories 81 to 83.

FIG. 8C shows an embodiment of an analog-type correction current source which varies the drain current by controlling the charge amount at a floating gate of MOSFET90. In this case, the amplitude of current can be controlled in an analogous manner and the switches are not used. The occupied area of correction current source becomes smaller in comparison with the digital type correction current source.

Figure 9:
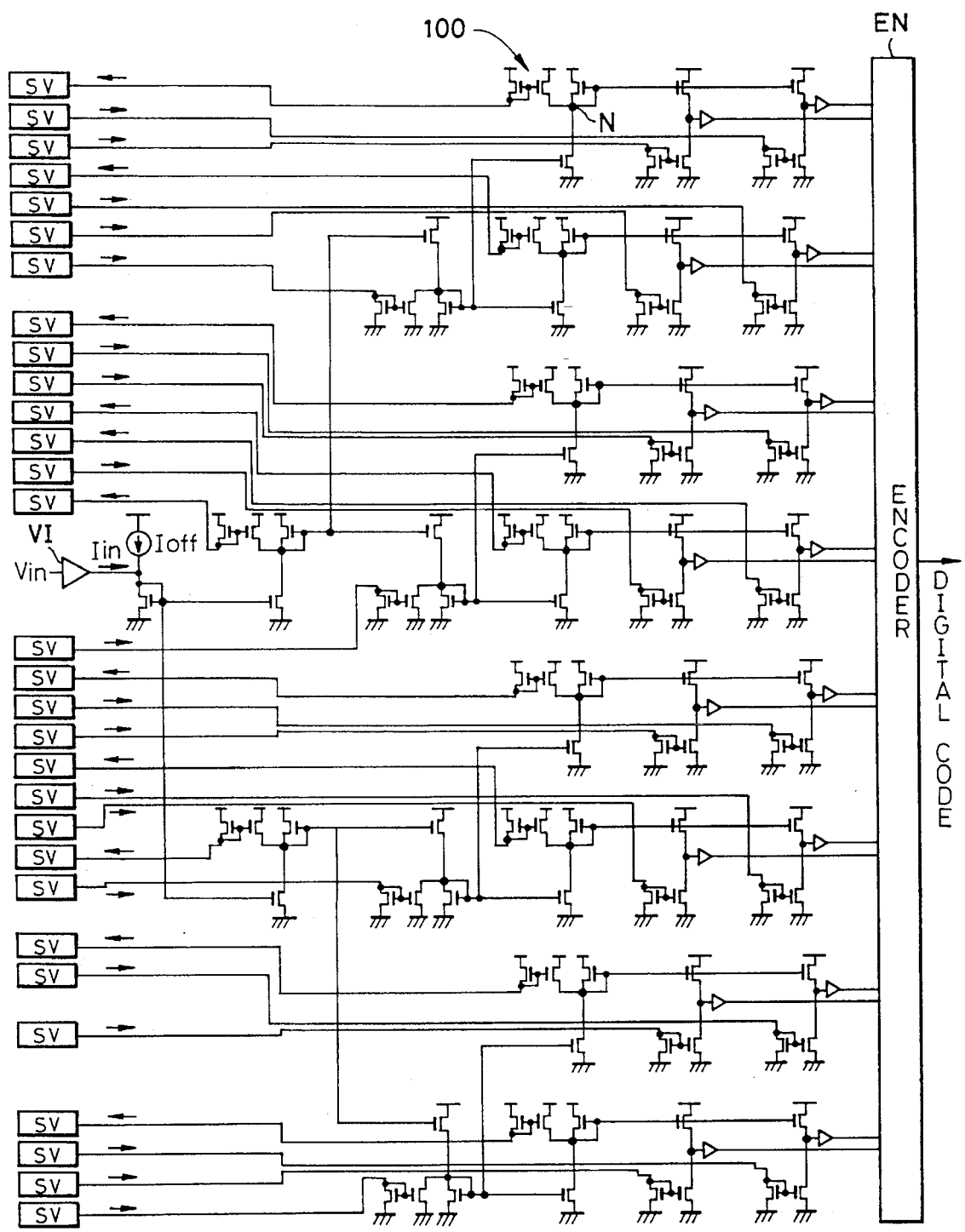
FIG. 9 a circuit diagram of a further embodiment of the A/D converter, in which the current correction circuit is employed in the circuit of FIG. 1.

FIG. 9 is an embodiment, in which correction (variable) current sources SV are employed as subtracting comparison current sources. Outputs of respective current sources SV are supplied to respective subtracting nodal point N via current mirror circuit 100 for reducing parasitic capacitance of the signal path. By utilizing the correction current source, compensation can be made for degradation of characteristics of the current mirror circuit and fluctuation of elements upon lowering of the power source voltage. In particular, when the MOSFET is employed as the transistor, fluctuation of the elements causes problems. By performing the correction as set forth above, a minimum size MOS transistor can be employed thereby improving speed.

Hereinbelow, further embodiments of the A/D converter according to the present invention are described. For instance, it is possible to vary the size of the transistors in the current mirror circuits, in such a manner that smaller-sized transistors are employed in the current mirror circuit closer to the terminal end of the tree structure. In general, the current range necessary for comparison becomes smaller toward the later stage. Therefore, the size of the transistor can be made smaller at later stages in the tree structure. The smaller size of the transistor contributes in reducing propagation delay in propagation of the signal through the tree structure.

Also, in part of the conversion by the tree structure, it is possible to add the comparison current to provide an offset instead of subtracting the comparison current. By taking the comparison current as the bias current component of the signal current, adjustment of the comparison current at the later stage of the tree structure and maintaining speed and precision of the current mirror circuit, can be achieved. On the other hand, by employing the A/D converter of the present invention as a parallel-type A/D converter (flash A/D converter) within a series-parallel A/D converter (subranging A/D converter), the A/D converter with a lower power source voltage, a smaller chip area and smaller consumed current than those of the parallel-type A/D converter, can be realized.

Figure 10:
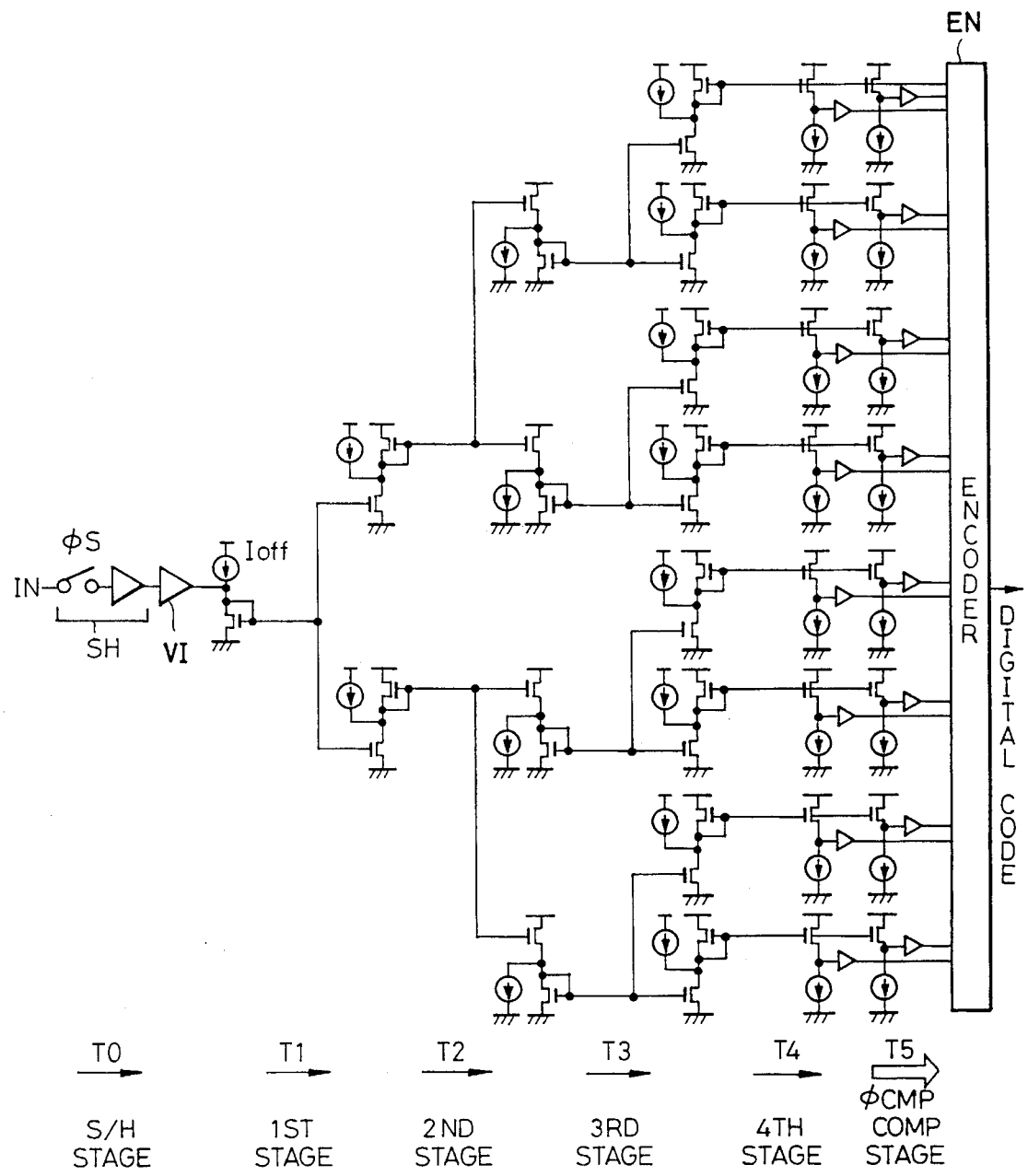
FIG. 10 is an illustration showing a still further embodiment of the A/D converter according to the invention.

Here, consideration is given for the signal propagation period in a 4-bit A/D converter of 1-bit 4-stage construction in the embodiment shown in FIG. 1. FIG. 10 shows a circuit, in which a sample/hold circuit SH is added to the input stage in the circuit of FIG. 1. In this circuit, the input signal current is split into the tree structure and, during propagation of the input signal current through the tree structure, subtraction of the comparison currents is performed in a hierarchical manner. The resultant current through such operation is finally compared with the comparison current to obtain the digital output.

Figure 11:
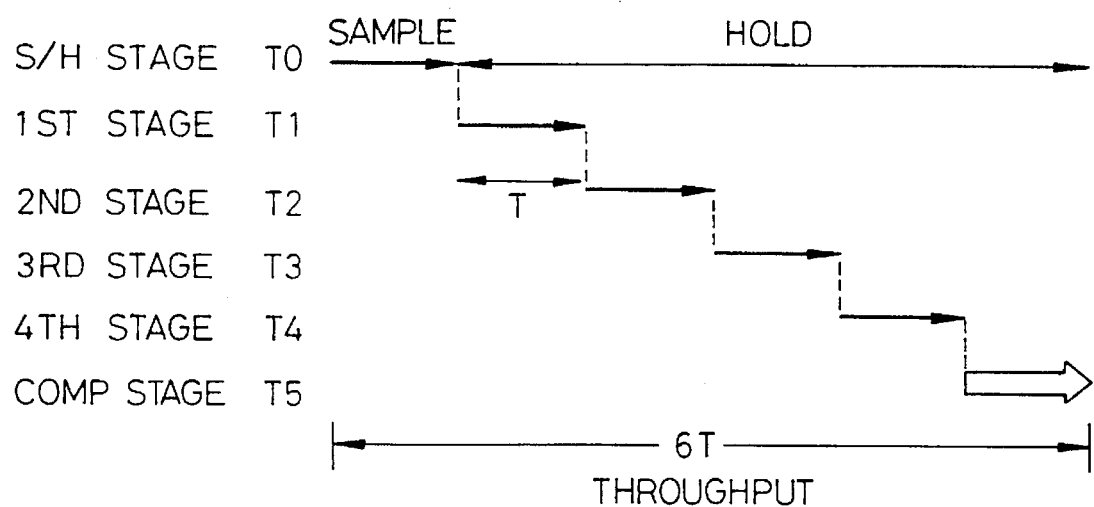
FIG. 11 is an illustration showing operation of the circuit of FIG. 10.

In this case, as shown in FIG. 11, the signal propagation delay periods T0 to T4 and the comparison period T5 in the comparator at the final stage are made completely equal to each other at T, a period required from input to obtain the output of the comparator becomes 6T in total.

Thus, the conversion speed (throughput) of the A/D converter in the tree structure is restricted mainly by a sum of the propagation delay period through all stages of the tree structure and the comparison period of the comparator. Accordingly, even when the operation of the comparator is fast, the conversion speed is influenced by the propagation period in the signal path in the tree structure.

Figure 12:
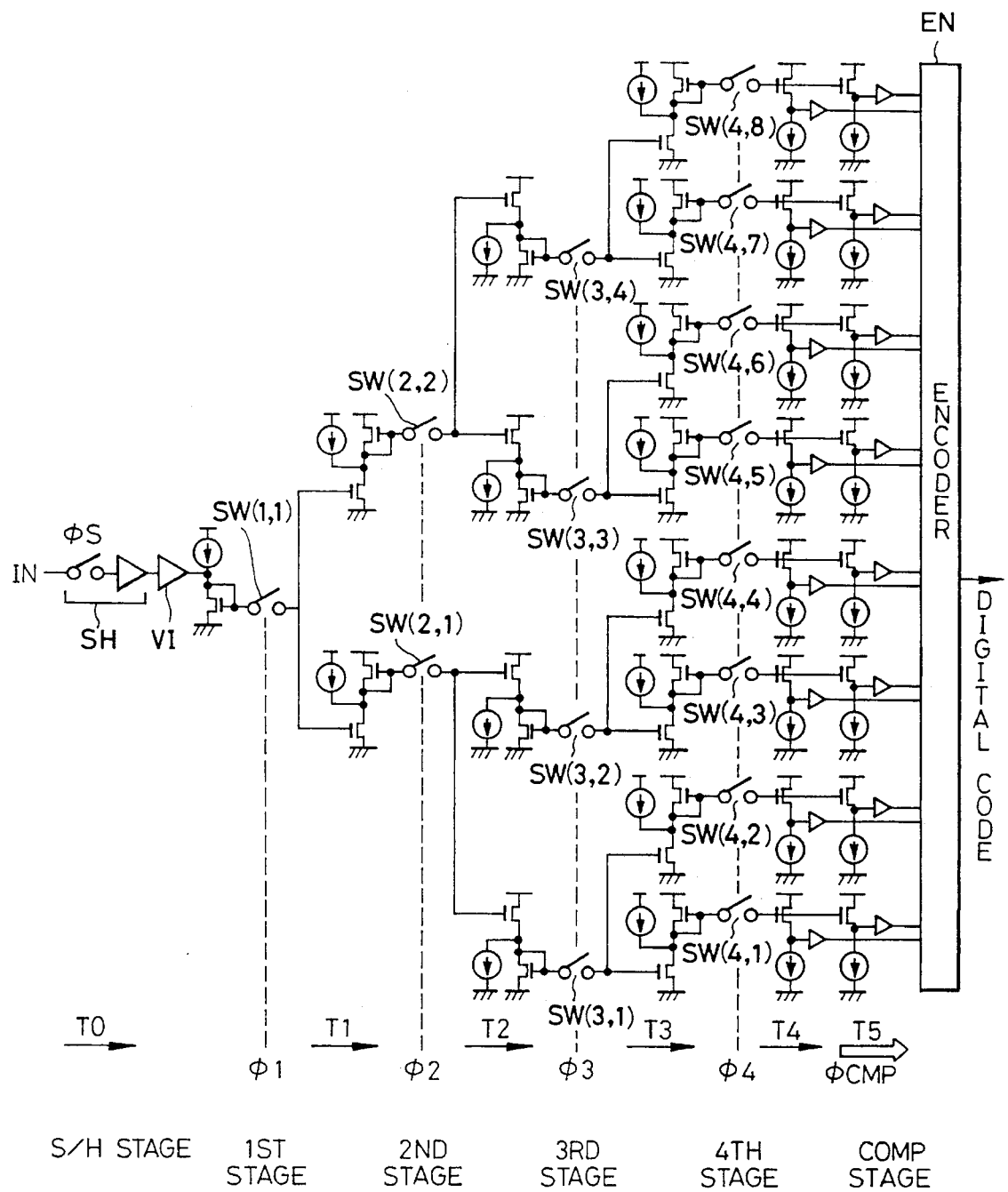
FIG. 12 is a circuit diagram showing a still further embodiment of the A/D converter according to the present invention.

Therefore, a circuit shown in FIG. 12 is obtained. namely, a switch (i,j) for establishing and blocking a common connection of the gate electrode of the input transistor of the current mirror circuit in each stage of the circuit of FIG. 10 and gate electrodes of a plurality of output transistors, is provided. Here, (i, j) represents the ith stage and the ith order from the lowermost one.

The circuit in FIG. 12 is discussed below. For simplification of explanation, the conversion speed of the A/D converter is determined by the sample/hold circuit SH, the portion of the tree structure and the comparator.

The sample/hold circuit SH at the input stage samples and holds the input voltage by turning ON and OFF which is accomplished by a sampling clock $\phi_s$ and by a sampling switch. The sample/hold output is converted into the current by the V/I converter VI. The comparator performs comparisons in synchronism with a clock signal $\phi_{CMP}$. The switches SW (k, 1) to SW (k, $2^{(k-1)}$) (wherein k represents kth stage) are turned ON and OFF at respective stage by clock signal. The sampling clock in the sample/hold circuit is assumed to be $\phi_s$ and clock signals at respective stages are assumed to be $\phi 1$ to $\phi 4$, respectively.

Figure 13A:
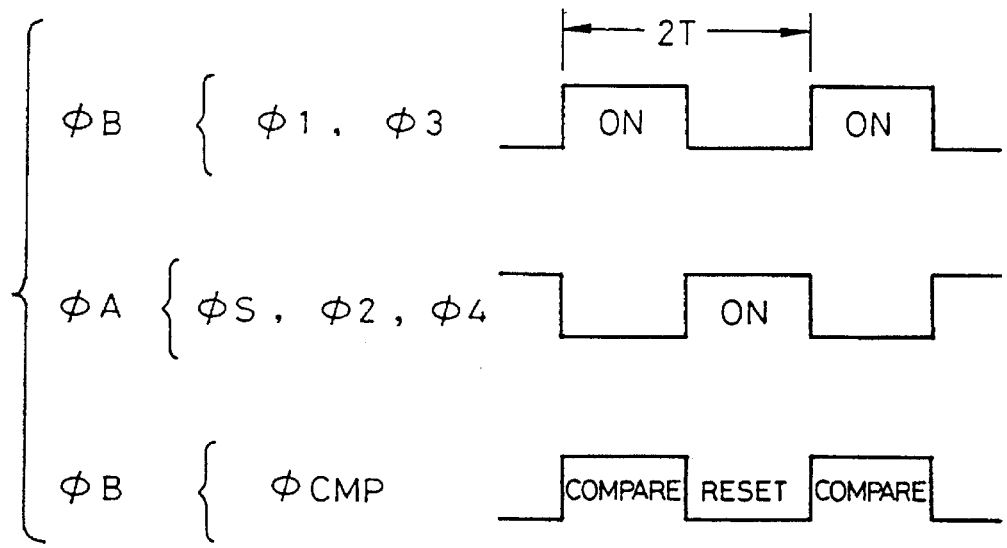
FIGS. 13A and 13B are illustrations showing operation of the circuit of FIG. 12.

The phase relationship of respective clock signals are as shown in G in FIG. 13A. In the shown embodiment, the clock signals $\phi S$, $\phi 2$ and $\phi 4$ are generally represented by $\phi A$, and similarly, $\phi 1$ and $\phi 3$ and $\phi CMP$ are represented by $\phi B$. respective switches are ON while the clock signals are "H" and OFF while the clock signals are "L". The comparator performs comparison when the clock signal is "H".

When $\phi A$ is "H", the input signal is sampled in the sample/hold circuit. At the same time, the switches of the second stage and the fourth stage current mirror circuits are turned ON to propagate the voltage signal equal to the gate voltage of the input transistor to the gate of the output transistors of these current mirror circuits to be sampled.

On the other hand, when $\phi B$ is "L", the switches of the current mirror circuits in the first stage and the third stage are held OFF. Therefore, at the gates of the output transistors of these current mirror circuits, the signal voltages are maintained. Thus, the output current of the current mirror circuit is also maintained. Since a parasitic capacitance is present at the gate of the output transistor of the current mirror circuit, the voltage can be maintained.

Next, when the $\phi A$ becomes "L", the input signal is held in the sample/hold circuit SH. At the same time, the switches in the current mirror circuits at the first and third stages turn ON. Thus, the voltage signal equal to the gate voltage of the input transistor is propagated to the gate of the output transistors of these current mirror circuits to be sampled.

On the other hand, at this time, since the $\phi B$ becomes "L", the switches of the current mirror circuits in the second and fourth stages turn OFF to hold the signal voltages at the gates of the output transistors of these current mirror circuit. Also, the output currents are maintained. In conjunction therewith, the output currents of the fourth stage current mirror circuits are compared with the comparison current so as to output the digital output.

By alternately performing the foregoing operations, the nominal signal propagation period becomes the propagation period for one stage T. Therefore, conversion can be performed at a throughput corresponding to the clock period 2T of φA.

Figure 13B:
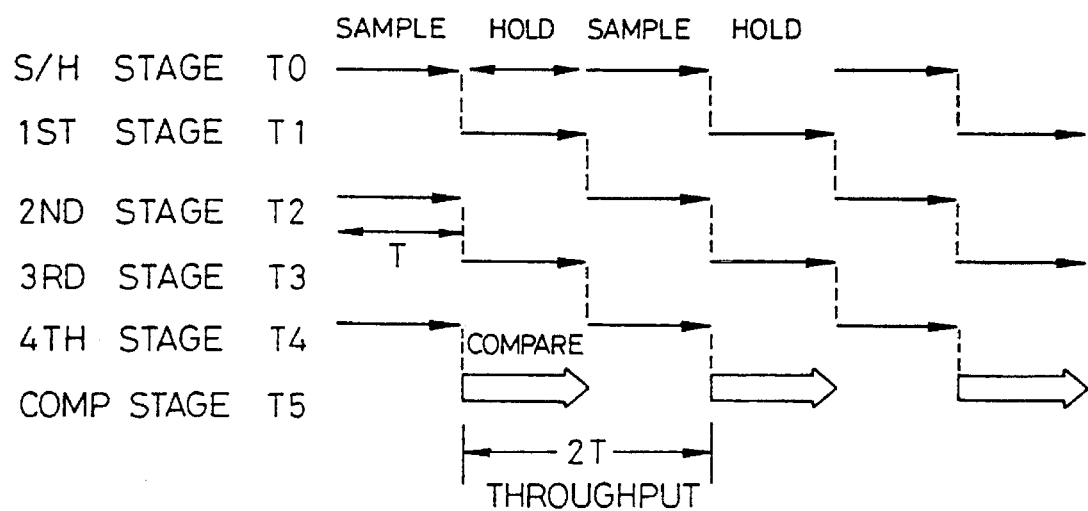

FIG. 13B shows a timing chart of conversion in a pipeline operation. Here, for simplifying discussion, it is assumed that the signal propagation period at each stage and the comparison period of the comparator are equal to each other at T. As can be seen from FIG. 13B, the pipeline operation can be performed at a throughput of 2T periods. On the other hand, the timing chart of conversion performed by the circuit of FIG. 10 becomes as illustrated in FIG. 11. In this case, the throughput in conversion is 6T. Therefore, the circuit of FIG. 12 achieves a conversion speed (throughput) three times higher than that of the circuit of FIG. 10.

While the parasitic capacitance of the gate of the transistor is utilized to hold capacitance in the shown embodiment, it is possible to insert a capacitive element in parallel thereto.

On the other hand, while the foregoing embodiment is directed to the four-stage binary tree, the structure of the A/D converter is not limited to the specific structure and the number of stages can be arbitrarily established. In general, in n stages of a tree structure. assuming that the signal delay at each stage and the delay at the sample/hold circuit and the comparator are respectively T, the conversion speed in the circuit in FIG. 10 becomes (n+2)T. However, in the case of the circuit construction of FIG. 12 to perform a pipeline operation at every other stage, the conversion period (throughput) becomes 2T. When a pipeline operation is performed at every two stages, the conversion period becomes 4T. In this manner, when a pipeline operation is performed at every m stages, the conversion period becomes 2mT.

Figure 14:
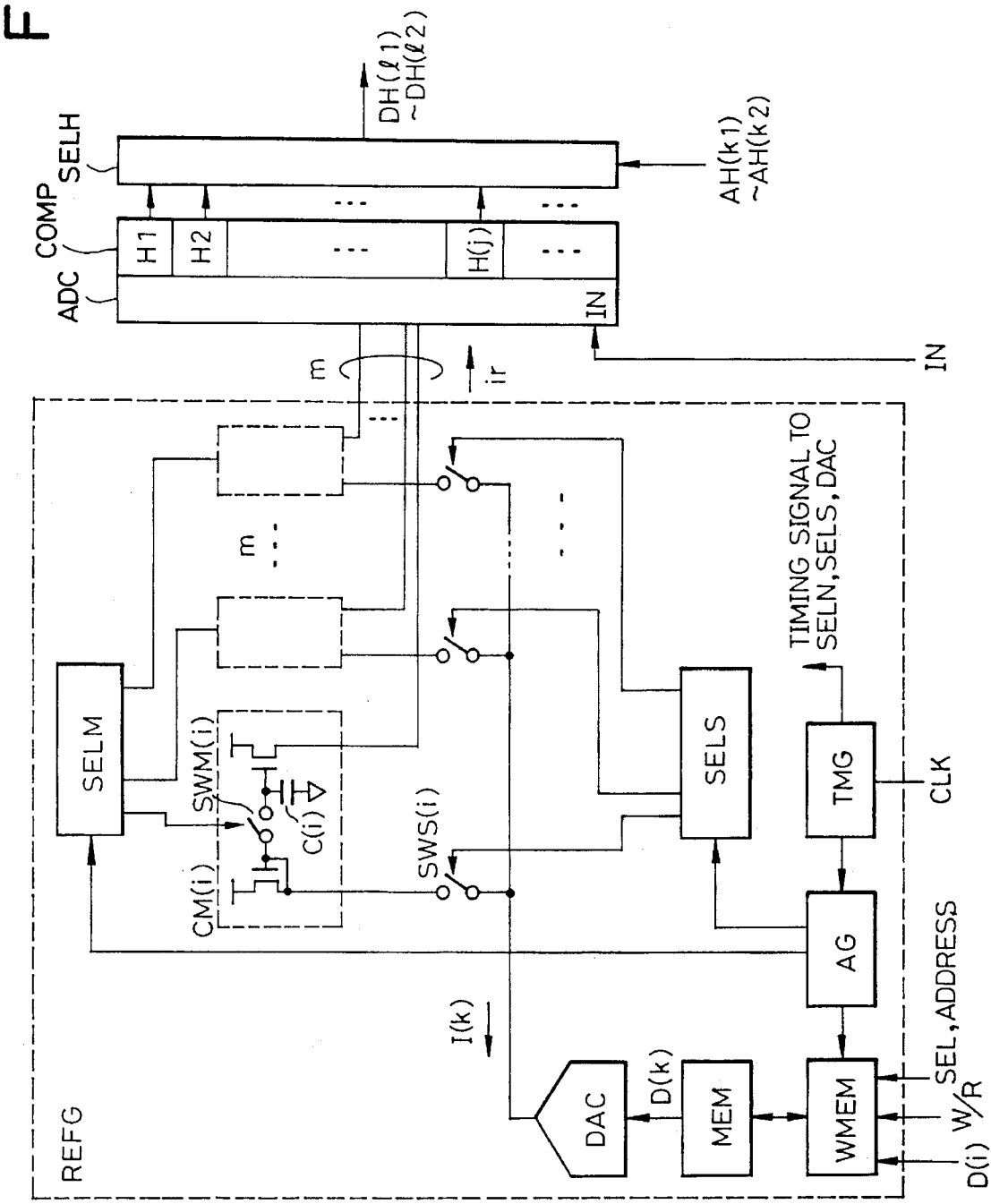
FIG. 14 is a block diagram of a circuit for correcting a current value of a variable current source for comparison reference.

FIG. 14 is a block diagram of a circuit for correcting the current value of the variable current source where the variable current source is used in place of the subtracting comparison current. An A/D converter main body (core) portion ADC in the tree structure has comparators H1 to Hi at the final stage. These comparator outputs are selectively output by a selection circuit SELH by selecting AH(k1)~AH(k2).

The variable current sources CM(i) for supplying the subtracting comparison current to respective subtracting nodal points in the A/D converter core portion ADC have current mirror construction. The gate electrodes of the input transistors and the output transistors of the current mirror circuits CM(i) are switched for establishing and blocking connection by switches SWM(i). To the gate electrodes of the output transistors, capacitive elements C(i) are connected in parallel. The output currents of the output transistors are supplied to the subtracting nodal points in the A/D converter core portion ADC. Switches SWS(i) for selectively turning ON and OFF the respective inputs of the current mirror circuits CM(i) and the outputs of D/A converters DAC are provided.

A selector circuit SELS for selectively turning ON one of the switches SWS(i) and a selector circuit SELM for selectively turning ON one of the switches SWM(i) are provided.

In a memory MEM, the current value of each variable current source CM(i) is written as of digital data. Read out data D(k) read from the memory MEM is converted into an analog signal I(k) by the D/A converter and input to the corresponding variable current source CM(i) through the switch 20 SWS(i).

An address generating circuit AG cyclically generates synchronized addresses of the memory MEM and addresses designating respective outputs of the selector circuits SELS and SELM. A timing generator circuit TMG is designed for operating timing at respective portions.

Next, operation of the comparison reference signal current generating circuit REFG for generating m comparison reference signal currents will be discussed. For setting the comparison reference signal current ir(k) to be output to the k-th current mirror circuit CM(k), the switch SWS(k) is turned ON by the address generated by the address generator circuit AG to read the data D(k) of the memory MEM. Then, the output of the D/A converter DAC having the current output function is supplied to the current mirror circuit CM(k). When the output current of the D/A converter DAC becomes stable, the switch SWM(k) is turned ON. When the output current of the current mirror circuit CM(k) becomes stable, the switch SWM(k) is turned OFF, and subsequently the switch SWS(k) is turned OFF. Through these procedures, the comparison reference signal current ir(k) is set.

The current reference signal current ir(k) set in the current mirror circuit CM(k) is maintained for a given period by the charge voltage of the gate parasitic capacitance of the output transistor of the current mirror circuit or capacitive element C(i) parallel to the gate of the output transistor. By performing the setting of the current I(i) of all of m current mirror circuits CM(i) periodically (time division), m comparison reference signal currents can be stably supplied.

Correction of the comparison reference signal current, namely correction of the A/D converter is performed as follows. An appropriate value is preliminarily written in the memory MEM as data D(i). Then, the comparison reference signal current generating circuit REFG is operated. A calibration reference signal is input to an input terminal IN of the A/D converter code portion ADC. At this time, the output of the comparator H(k) in the A/D converter code portion ADC is selected by the selection circuit SELH. Then, the data value D(k) in the memory MEM is adjusted so that the output of the comparator H(k) becomes a desired value so as to perform correction of the comparison reference signal current. By inputting the calibration reference signals corresponding to all of the comparators H(i) to the input terminals IN, and effecting correction for all of the comparison reference signal current I(i), a correcting operation is terminated. Refresh operation frequency in the comparison reference signal current generating circuit REFG at correction operation and actual A/D conversion are set to be equal. Through the process set forth above, the supply and correction of the comparison reference signal current are performed.

The correction obtains data value D(i) canceling all errors of the D/A converter DAC, the current mirror circuit CM(i) and the switch SWM(i) in the current mirror circuit CM(i).

Multiple comparison reference signal current generating circuits REFG may be provided in the A/D converter. When a plurality of the comparison reference signal current generating circuits are provided in the A/D converter, the refresh operation frequency in each comparison reference signal current generating circuit REFG can be made smaller. Also, it is possible to employ the comparison reference signal current generating circuit in combination with the conventional comparison reference signal generating means.

Figure 15:
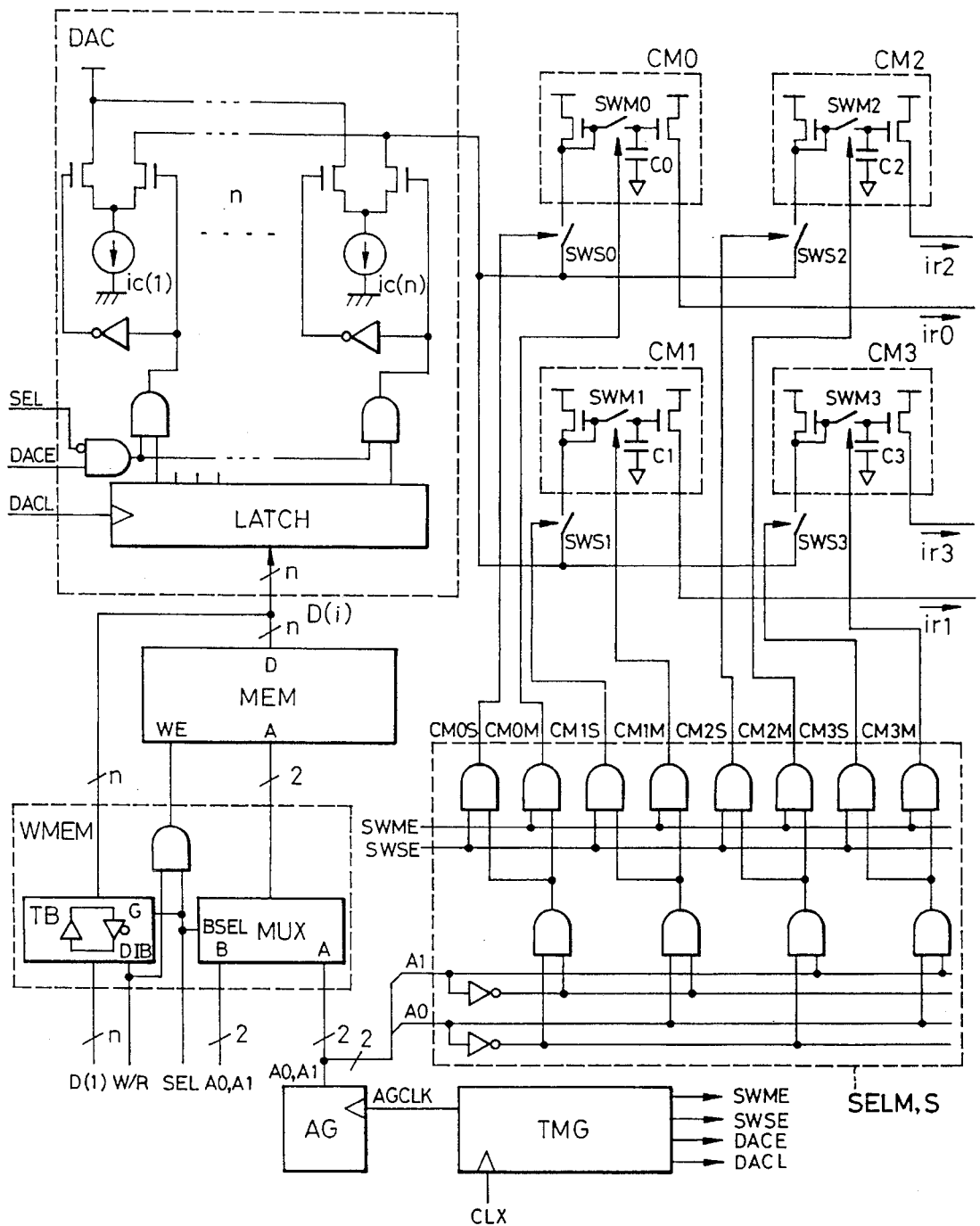
FIG. 15 is a circuit diagram showing an example of the circuit of FIG. 14.

FIG. 15 shows an example of respective parts of the comparison reference signal generating circuit REFG. The example is adapted to couple four reference signal currents ir0, ir1, ir2 and ir3. In practice, a greater number of comparison reference signal currents can be generated. Hereinafter, all of the shown signals have positive logical values. The switches are ON at 1 and OFF at 0.

The data value D(i) of the memory MEM is n-bit data. A signal SEL turns the data value to 1 when memory MEM is accessed from an external source to the comparison reference signal current REFG. A signal W/R is 1 when data value D(i) is to be written in and 0 when the data value D(i) is to be read out. Signals A0 and A1 are addresses of the memory MEM. A signal DACE is a signal for latching the input. A signal SWME is set at 1 when the switch SWM(i) in the current mirror circuit CM(i) is accessed. A signal SWSE is set at 1 when the switch SWS(i) is to be accessed. Also, CLK is a reference clock signal that is externally supplied. It is noted that CM(i) represents CM0, CM1, CM2, . . . , in FIG. 15.

CM(i) is the current mirror circuit having the switch SWM and the capacitive element C. DAC is the D/A converter adding a unit current source ic(i) which is appropriately weighted. The D/A converter DAC has a latch LATCH at the input. The latch LATCH is designed to latch the data at the rising edge of a signal DACL. Here, since a current absorbing-type D/A converter DAC is employed, the current mirror circuit CM(i) employs a P-channel MOSFET. However, when a current discharge-type D/A converter DAC is employed, an N-channel MOSFET is employed.

SELM and SELS (SELM,S) are decoders taking address A0 and A1 and selecting switches SWM(i) and SWS(i) with SWME and SWSE. The timing generating circuit TMG generates a reference clock AGCLK for signals SWME, SWSE, DACE, DACL and AG taking clock CLK as a reference and supplies it to various portions of the circuit. The timing generation circuit TMG may be easily constructed with a counter and certain logic gates in the delay circuit.

The address generating circuit AG cyclically generates addresses of the current mirror circuit CM(i) to be refreshed synchronized with the clock AGCLK. The address generating circuit AG may be easily constructed with a counter and certain logic gates in the delay circuit. The memory MEM has an address port A and write signal WE as inputs and data port D as an input/output. Memory, such as static RAM, dynamic RAM and non-volatile memory, such as an EEPROM may be employed.

A writing control circuit WMEM is a control circuit for exchanging data with the comparison reference signal current generating circuit REFG and the memory MEM. A multiplexer MUX output switches inputs A and B to output to memory MEM. When signal BSEL is 1, B is output. When the signal BSEL is 0, A is output. TB is a tri-state buffer for avoiding collision between the output data of the memory MEM and the external data. When a signal G is 0, input and output are separated. When a signal DIR is 1, writing of external data to the memory is permitted. By employing a dual port RAM and so forth as the memory MEM, the writing control circuit WMEM can be simplified.

Figure 16:
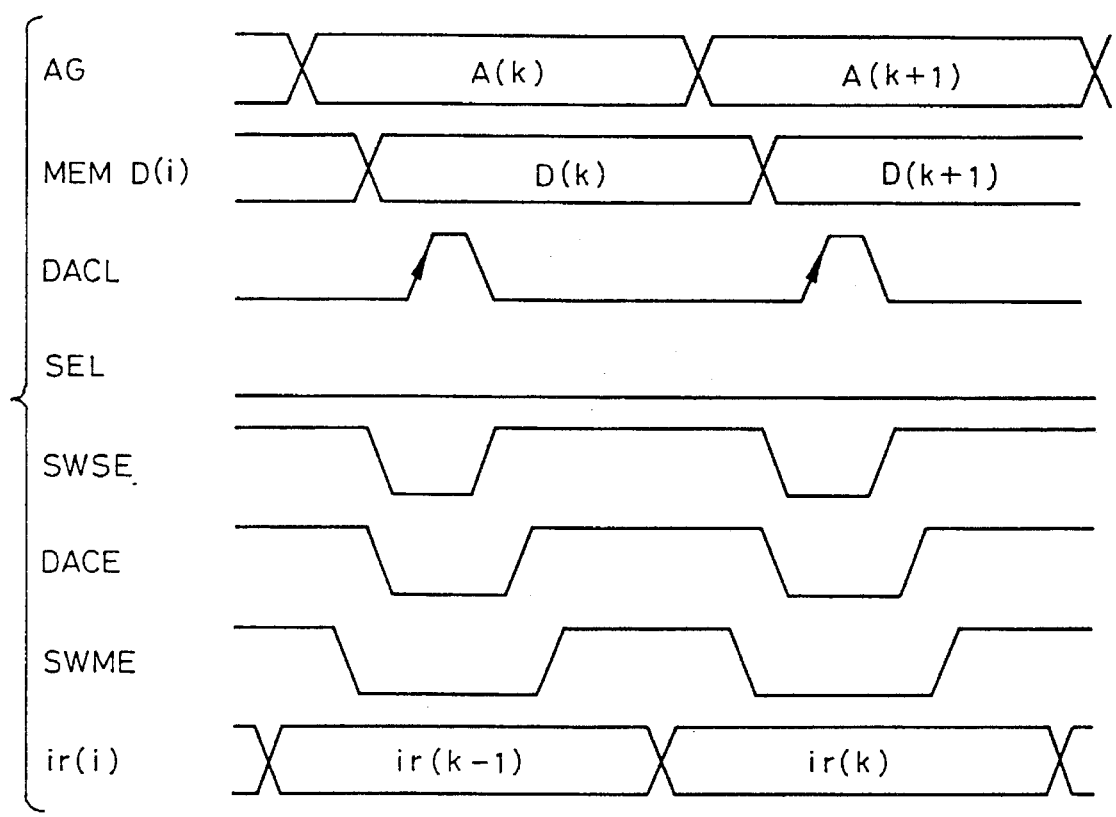
FIG. 16 is a timing chart showing operation of the circuit of FIG. 15.

FIG. 16 shows a timing chart of signals at various points of the comparison reference signal current generating circuit of FIG. 15.

Figure 17:
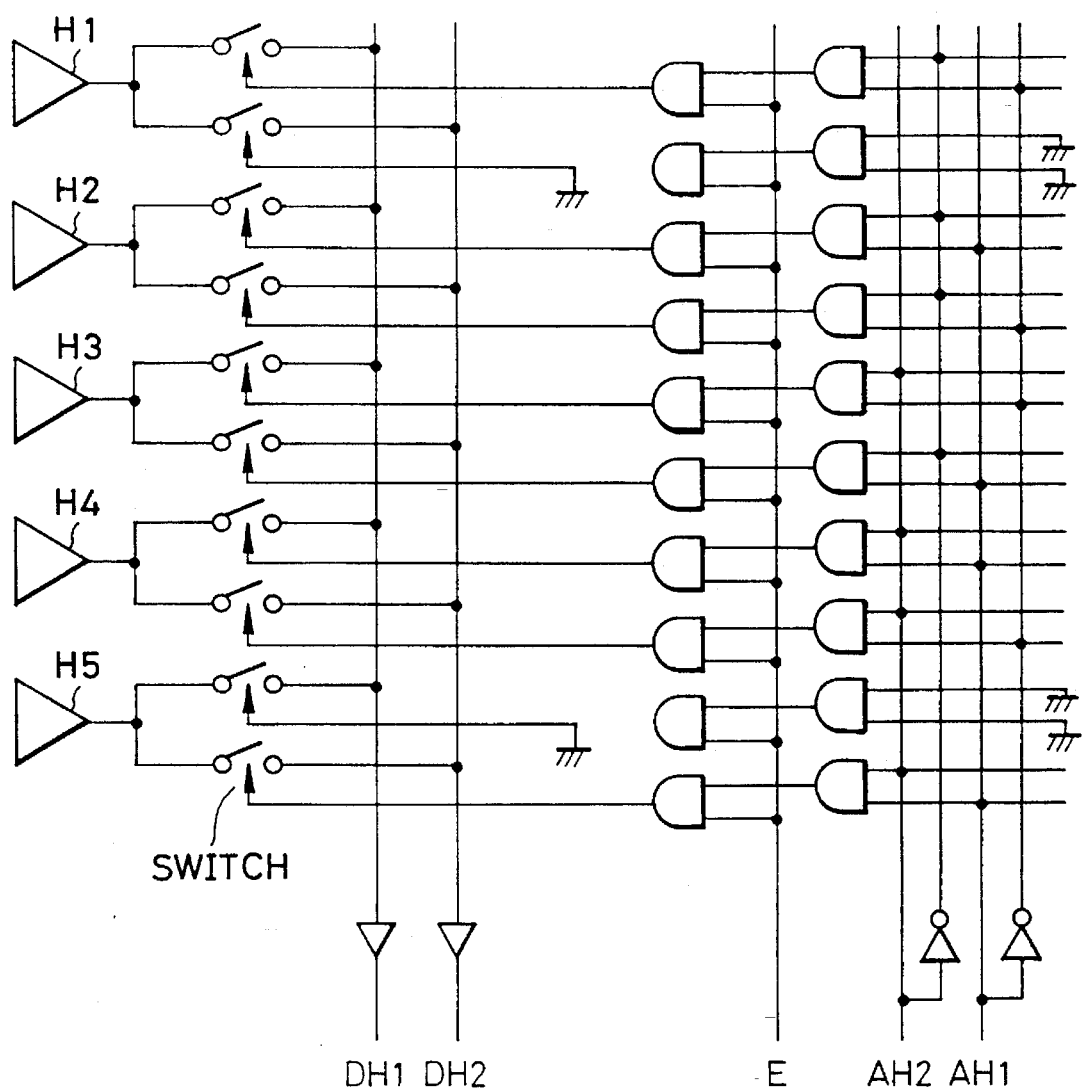
FIG. 17 is a circuit diagram showing a partial example of the circuit of FIG. 14.

FIG. 17 shows an example of a selection circuit SLEH (see FIG. 14) for selecting outputs of the comparator H(i).

Shown in the embodiment is a circuit for selecting two outputs DH1 and DH2 out of five outputs of the comparators H1 to H5 based on AH1 and AH2.

It should be noted that the signal E is a signal for turning OFF all switches SWITCH.

Although the invention has been illustrated and described with respect to exemplary embodiments thereof, it should be understood by those skilled in the art that various other changes, omissions and additions may be made therein and thereto, without departing from the spirit and scope of the present invention. Therefore, the present invention not limited to the specific embodiments set out above but includes all possible embodiments within the scope encompassed (and equivalents thereof) with respect to the features set out in the appended claims.

What is claimed is:

1. An analog-to-digital converter comprising:

an input current mirror circuit having a current input terminal for receiving an analog signal current and having a plurality of current output terminals;

a constant current source supplying a constant current to said current input terminal;

means for subtracting said constant current from said analog signal current;

a tree structure for routing said input current mirror circuit, said tree structure including branches, said branches including a plurality of signal paths;

each stage of said tree structure comprising:
   a plurality of current mirror circuits, each having an input terminal for inputting a current of a corresponding one of a plurality of output terminals of a preceding current mirror circuit in a preceding stage and a plurality of current output terminals;
   a plurality of constant current sources supplying constant current to said plurality of current output terminals of each current mirror circuit within a stage; and
   a plurality of means for subtracting said constant current from said output current of the corresponding current mirror circuit in the preceding stage; and said analog-to-digital converter further comprising a plurality of current comparator circuits comparing respective output current values of said current output terminals of a current mirror final stage of said tree structure with respective reference current values, wherein comparator outputs of said plurality of current comparator circuits comprise digital signals.

2. An analog-to-digital converter as set forth in claim 1, which further comprises an encoder for converting said comparator outputs of said plurality of current comparator circuits into a digital code.

3. An analog-to-digital converter as set forth in claim 2, further comprising:

comparing means for comparing the output current value of said input current mirror circuit with a predetermined current value;

current shutting-off means for selectively shutting-off the output currents of current mirror circuits at respective stages of said tree structure depending upon the results of comparisons by said comparing means; and level determining means for determining a value of the result of said comparison corresponding to the branch of the output current path of one of the current mirror circuits which is shut off by said current shutting-off means.

4. An analog-to-digital converter as set forth in claim 3, wherein said input current mirror circuit further includes an additional current output terminal, and said comparing means compares the output current value at said additional current output terminal and said predetermined current value.

5. An analog-to-digital converter as set forth in claim 3, wherein said input current mirror circuit includes means for generating a voltage depending upon the output current, and said comparing means includes a voltage comparator comparing said voltage depending upon the output current, the voltage corresponding to said predetermined current value.

6. An analog-to-digital converter as set forth in claim 1, wherein a size of transistor elements forming said current mirror circuits are smaller at later stages in said tree structure.

7. An analog-to-digital converter as set forth in claim 1, wherein:
said input current mirror circuit includes an input transistor, a plurality of output transistors having control electrodes commonly connected to the control electrode of said input transistor, and a switch for turning ON and OFF a connection between said control electrode of said input transistor and control electrodes of said output transistors;
each of said current mirror circuits in each stage of said tree structure including an input transistor, a plurality of output transistors having control electrodes commonly connected to the control electrode of said input transistor, and a switch for turning ON and OFF said common connection between said control electrode of said input transistor and control electrodes of said output transistors; and
said analog-to-digital converter including an ON/OFF control means for ON/OFF controlling said switch of said input current mirror circuit and said switches of said current mirror circuits in respective stages of said tree structure.

8. An analog-to-digital converter as set forth in claim 7, wherein said ON/OFF control means includes means for generating a first clock pulse for simultaneously controlling the switch of said input current mirror circuit at a root of said tree structure and switches of said current mirror circuits in respective even number stages in said tree structure and a second clock having a reverse phase to said first clock pulse for simultaneously controlling switches of the current mirror circuits in the remaining stages.

9. An analog-to-digital converter as set forth in claim 7, wherein gates of each output transistor in said input current mirror circuit and said current mirror circuits at respective stages in said tree structure each have capacitive elements connected in parallel.

10. An analog-to-digital converter as set forth in claim 7, which further comprises:
a sample/hold circuit for sample/holding the input signal level; and
a voltage-to-current converter for converting the output of said sample/hold circuit into said analog signal current.

11. An analog-to-digital converter as set forth in claim 10, wherein said sample/hold circuit performs sample/holding based on said second clock pulse.

12. An analog-to-digital converter as set forth in claim 1, wherein each of said constant current sources comprises a current mirror means said current mirror means comprising an input transistor, a plurality of output transistors having control electrodes commonly connected to the control electrode of said input transistor, and a switch for turning ON and OFF a common connection between said control electrode of said input transistor and control electrodes of said output transistors, and a capacitive element provided in parallel to said control electrode of said output transistor; and said analog-to-digital converter further comprising:
a memory storing digital data;
a digital-to-analog converter circuit for converting output data of said memory into an analog current;
a switch group comprising a plurality of switches for turning ON and OFF connecting states of the output terminals of said digital-to-analog converter and input electrodes of the input transistors of each said current mirror circuit;
first control means for generating an address signal for selectively turning ON one switch of said current mirror circuit;
second control means for generating an address signal for selectively turning ON one switch of the switch group; and
address generating means for cyclically generating an address signal for said memory and address signals of said first and second control means synchronized with each other.

13. An analog-to-digital converter as in claim 1, wherein said means for subtracting includes means for adding an offset current to said analog signal current.

14. An analog-to-digital converter as in claim 1, further comprising a precomparator connected to said tree structure, said pre-comparator for selectively limiting current from a portion of said tree structure.

15. An analog-to-digital converter as in claim 14, wherein said precomparator causes said final stage to output a predetermined value when said comparators in said final stage produce an undetermined result.

16. An analog-to-digital converter as in claim 1, wherein said analog signal current comprises a variable current and said means for subtracting includes means for correcting said variable current.

17. An analog-to-digital converter comprising:
an input for receiving an analog signal;
a tree structure, connected to said input, comprising a plurality of mirror circuits and a plurality of tree structure outputs;
a plurality of comparators, each connected to a tree structure output of said tree structure outputs; and
an encoder, connected to said comparators, for outputting a digital code,
wherein said mirror circuits each comprise:
a mirror circuit input, connected to one of a previous mirror circuit of said mirror circuits and said input, for receiving said analog signal;
a subtracting node connected to said mirror circuit input;

a constant current source for supplying a constant current to said subtracting node, wherein said subtracting node subtracts said constant current from said analog signal; and a mirror circuit output connected to said subtracting node and one of said comparators and a subsequent mirror circuit of said mirror circuits.

18. An analog-to-digital converter as in claim 17, further comprising a pre-comparator connected to said tree structure, said pre-comparator for selectively limiting current from a portion of said tree structure.

19. An analog-to-digital converter as in claim 18, wherein said tree structure includes a final stage and said pre-comparator causes a comparator of said comparators to output a predetermined value when a mirror circuit of said mirror circuits in said final stage produces an undetermined result.

20. An analog-to-digital converter as in claim 17, wherein said analog signal current comprises a variable current and said mirror circuits each include means for correcting said variable current.

* * * * *